United States Patent
Matsushita et al.

(10) Patent No.: US 7,138,283 B2
(45) Date of Patent: Nov. 21, 2006

(54) METHOD FOR ANALYZING FAIL BIT MAPS OF WAFERS

(75) Inventors: Hiroshi Matsushita, Yokohama (JP); Kenichi Kadota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 220 days.

(21) Appl. No.: 10/865,927

(22) Filed: Jun. 14, 2004

(65) Prior Publication Data

US 2005/0021303 A1 Jan. 27, 2005

(30) Foreign Application Priority Data

Jun. 18, 2003 (JP) .............................. 2003-173838

(51) Int. Cl.
*G01R 31/26* (2006.01)

(52) U.S. Cl. .................................. 438/14; 257/E21.531

(58) Field of Classification Search .................... 438/5, 438/7, 10–11, 14, 16–18, 22–24, 29, 31, 34–36, 438/128–130, 149, 484, 538; 700/99–120
See application file for complete search history.

(56) References Cited

U.S. PATENT DOCUMENTS

| 6,727,106 B1 * | 4/2004 | Ankutse et al. ................ 438/5 |
| 2002/0196969 A1 * | 12/2002 | Behkami et al. ............ 382/149 |
| 2003/0003608 A1 * | 1/2003 | Arikado et al. ............... 438/14 |
| 2003/0011376 A1 | 1/2003 | Matsushita et al. |
| 2003/0019840 A1 * | 1/2003 | Smith et al. .................. 216/60 |

FOREIGN PATENT DOCUMENTS

| JP | 9-180976 | 7/1997 |
| JP | 9-191032 | 7/1997 |
| JP | 10-284564 | 10/1998 |
| JP | 2002-124555 | 4/2002 |
| JP | 2002-289662 | 10/2002 |
| JP | 2002-359266 | 12/2002 |

OTHER PUBLICATIONS

K. Mitsutake, et al., IEEE Proc. 10th Int. Symp. Semiconductor Manifacturing, pp. 247-250, "New Method of Extraction of Systematic Failure Component", 2001.
H. Matsushita, et al., IEEE Transactions on Semiconductor Manufacturing, vol. 15, No. 4, pp. 506-512, "Highly Sensitive Inspection System for Lithography-Related Faults in Agile-Fab-Detecting Algorithm for Monitoring and Evaluation of Yield Impact", Nov. 2002.

* cited by examiner

Primary Examiner—Michael Lebentritt
Assistant Examiner—Andre' Stevenson
(74) Attorney, Agent, or Firm—Oblon, Spivak, McClelland, Maier & Neustadt, P.C.

(57) ABSTRACT

A method of detecting a wafer failure includes extracting the wafer ID of a target wafer in the target lot from the lot ID, extracting the location information of a failure in the target wafer, calculating a to-be-quantified first wafer feature amount for unevenness of a wafer failure distribution, calculating a first lot feature amount for each target lot, extracting a fabrication process for the target lot and a fabrication apparatus, carrying out a significant test for the fabrication apparatus used in each fabrication process, and detecting the fabrication apparatus with a significant difference as a first abnormal apparatus.

19 Claims, 20 Drawing Sheets

| LOT FEATURE AMOUNT | TEST NAME | SECTION | CALCULATION METHOD | LOT #1 | LOT #2 | ..... | LOT #100 |
|---|---|---|---|---|---|---|---|
| AVERAGE | DC | 1 | FAILURE DENSITY | 0.38 | 0.78 | ..... | 0.11 |
| AVERAGE | DC | 2 | FAILURE DENSITY | 0.78 | 0.12 | ..... | 0.45 |
| : | : | : | : | : | : | : | : |
| PARITY | Function | 74 | INHOMOGENEITY | 1.65 | 3.56 | ..... | 0.98 |
| : | : | : | : | : | : | : | : |
| FIRST / SECOND HALF | Margin | 150 | INHOMOGENEITY | 3.24 | 0.87 | ..... | 1.45 |

FIG. 11

| LOT FEATURE AMOUNT | TEST NAME | SECTION | CALCULATION METHOD | PROCESS 1 APPARATUS A | PROCESS 2 APPARATUS B | . . . . | PROCESS 300 APPARATUS Z |
|---|---|---|---|---|---|---|---|
| AVERAGE | DC | 1 | FAILURE DENSITY | 0.98 | 1.47 | . . . . | 7.89 |
| AVERAGE | DC | 2 | FAILURE DENSITY | 2.45 | 1.44 | . . . . | 1.24 |
| : | : | : | : | : | : | : | : |
| PARITY | Function | 74 | INHOMOGENEITY | 3.42 | 14.25 | . . . . | 0.87 |
| : | : | : | : | : | : | : | : |
| FIRST/SECOND HALF | Margin | 150 | INHOMOGENEITY | 0.78 | 1.45 | . . . . | 3.25 |

FIG. 12

| LOT FEATURE AMOUNT | TEST NAME | SECTION | CALCULATION METHOD | PROCESS | APPARATUS | TESTED VALUE |
|---|---|---|---|---|---|---|
| PARITY | Function | 32 | INHOMOGENEITY | 72 | M | 38.6 |
| AVERAGE | Margin | 98 | FAILURE DENSITY | 146 | P | 33.2 |
| MAXIMUM VALUE | DC | 127 | FAILURE DENSITY | 187 | Q | 12.8 |

FIG. 22

| LOT FEATURE AMOUNT | TEST NAME | CATEGORY NO. | LEVEL | CALCULATION METHOD | LOT #1 | LOT #2 | ..... | LOT #100 |
|---|---|---|---|---|---|---|---|---|
| AVERAGE | DC | 1 | LEVEL 1 | FAILURE DENSITY | 0.47 | 0.11 | ..... | 0.47 |
| AVERAGE | DC | 1 | LEVEL 2 | FAILURE DENSITY | 0.86 | 0.32 | ..... | 0.87 |
| ⋮ | ⋮ | ⋮ | ⋮ | ⋮ | ⋮ | ⋮ | ⋮ | ⋮ |
| PARITY | Function | 2 | LEVEL 3 | INHOMOGENEITY | 3.54 | 1.47 | ..... | 1.44 |
| ⋮ | ⋮ | ⋮ | ⋮ | ⋮ | ⋮ | ⋮ | ⋮ | ⋮ |
| FIRST/ SECOND HALF | Margin | 3 | LEVEL 3 | INHOMOGENEITY | 2.50 | 0.77 | ..... | 4.58 |

FIG. 23

| LOT FEATURE AMOUNT | TEST NAME | CATEGORY NO. | LEVEL | CALCULATION METHOD | PROCESS | APPARATUS | TESTED VALUE | |
|---|---|---|---|---|---|---|---|---|
| PARITY | Function | 1 | 2 | INHOMOGENEITY | 72 | M | 39.9 | ⌒C |
| MAXIMUM VALUE | Margin | 1 | 3 | FAILURE DENSITY | 78 | N | 36.1 | ⌒D |
| ⋮ | ⋮ | ⋮ | ⋮ | ⋮ | ⋮ | ⋮ | ⋮ | |

FIG. 29

|    | W1 | W2 | W3 | W4 | W5 | W6 | W7 | W8 |
|----|----|----|----|----|----|----|----|----|
| W1 |    | ×  | ×  | ○  | ×  | ×  | ○  | ×  |
| W2 | ×  |    | ×  | ×  | ○  | ×  | ×  | ×  |
| W3 | ×  | ×  |    | ×  | ×  | ○  | ×  | ○  |
| W4 | ○  | ×  | ×  |    | ×  | ×  | ○  | ×  |
| W5 | ×  | ○  | ×  | ×  |    | ×  | ×  | ×  |
| W6 | ×  | ×  | ○  | ×  | ×  |    | ×  | ○  |
| W7 | ○  | ×  | ×  | ○  | ×  | ×  |    | ×  |
| W8 | ×  | ×  | ○  | ×  | ×  | ○  | ×  |    |

FIG. 30

| SIMILAR WAFER GROUP | NUMBER OF WAFERS | FAILURE CATEGORY | S1 | S3 | S4 | S6 | S7 | S8 | S2 | S5 |
|---|---|---|---|---|---|---|---|---|---|---|
| S1 | 3 | C1 | ╲ | X | ○ | X | ○ | X | X | X |
| S3 | 3 | C2 | X | ╲ | X | ○ | X | ○ | X | X |
| S4 | 3 | C1 | ○ | X | ╲ | X | ○ | X | X | X |
| S6 | 3 | C2 | X | ○ | X | ╲ | X | ○ | X | X |
| S7 | 3 | C1 | ○ | X | ○ | X | ╲ | X | X | X |
| S8 | 3 | C2 | X | ○ | X | ○ | X | ╲ | X | X |
| S2 | 2 | C3 | X | X | X | X | X | X | ╲ | ○ |
| S5 | 2 | C3 | X | X | X | X | X | X | ○ | ╲ |

METHOD FOR ANALYZING FAIL BIT MAPS OF WAFERS

CROSS REFERENCE TO RELATED APPLICATIONS

This application is based upon and claims the benefit of priority from prior Japanese Patent Application No. P2003-173838, filed on Jun. 18, 2003; the entire contents of which are incorporated herein by reference.

BACKGROUND OF THE INVENTION

1. Field of the Invention

The present invention relates to a failure detection method to detect an abnormal fabrication apparatus, which is used to manufacture semiconductor LSI circuits, based on the failure distribution for each wafer.

2. Description of the Related Art

To improve the manufacturing productivity of semiconductor LSI circuits, efforts for improvement in semiconductor LSI circuit yield continue to be made. To improve the yield, analysis of failures resulting in a decrease in the yield, identification of a manufacturing process, a fabrication apparatus, or LSI design rules causing failures have been made. However, LSIs are manufactured using several hundreds of fabrication processes, which are executed by several hundreds of fabrication apparatus. Therefore, it is difficult to identify a fabrication process and a fabrication apparatus resulting in failures, even if the failures in LSIs are identified.

There are roughly two types of LSI tests: a wafer test that is carried out before the fabrication process after the wafer manufacturing process, and a final test that is carried out after that fabrication process. The wafer test aims to decrease the number of failed chips entering the fabrication process. The final test aims to determine that LSIs satisfy performance requirements guaranteed by a manufacturer before shipment to users. In particular, the wafer test is carried out for circular wafers. By mapping and displaying failures in each wafer identified by the tests, the positions of those failures in that wafer can be determined. A fail bit map (FBM) for each memory device is a typical way to map failures.

The mapped wafer failures are roughly categorized according to two categories based upon the wafer failure distribution. The first category is for random failures, which evenly distributed within the wafer regardless of the positions therewithin; and the second category is for clustering failures, which are distributed unevenly. The clustering failures are considered to emanate from a certain fabrication process or a fabrication apparatus and cause a decrease in yield. The clustering failures are digitized, and the digitized values are then subjected to an inter-fabrication apparatus significant test.

SUMMARY OF THE INVENTION

According to an aspect of the present invention, a method is provided of detecting a fabrication apparatus generating a wafer failure using process history information. The method includes providing a plurality of sections in each of wafers, inputting a lot ID of a target lot, extracting a wafer ID of a target wafer among a plurality of wafers in the target lot from the lot ID and the process history information, extracting a failure location information in the target wafer from the wafer ID and test information configured to extract the failure location information in the wafers, calculating a to-be-quantified first wafer feature amount for unevenness of a wafer failure distribution based on the sections for the target wafer, calculating a first lot feature amount for the target lot from the first wafer feature amount calculated for the target wafer, extracting a fabrication process for the target lot and fabrication apparatuses used in the extracted fabrication process from the process history information using the lot ID of the target lot as an extraction condition, carrying out significant tests for the fabrication apparatuses used in the extracted fabrication process based on the first lot feature amount, and detecting a fabrication apparatus with a significant difference as a first abnormal apparatus.

According to another aspect of the present invention, a method is provided of detecting a wafer failure using process history information. The method includes providing a plurality of sections in each of wafers, inputting a lot ID of a target lot, extracting a wafer ID of a target wafer among a plurality of wafers in the target lot from the lot ID and the process history information, extracting the location information of a failure in the target wafer from the wafer ID and test information configured to extract a failure location information in the wafers, calculating a to-be-quantified first wafer feature amount for unevenness of the wafer failure distribution based on the sections for the target wafer, representing similarity among wafers by a correlation coefficient in terms of the first wafer feature amount, grouping the wafers based on whether the similarity is equal to or greater than a predetermined correlation coefficient threshold as a first abnormal wafer ID, extracting the failure location information with the first abnormal wafer ID from the test information, and, generating a plurality of wafer failure distribution maps as first abnormal wafer failure distribution maps from the failure location information with the first abnormal wafer ID.

According to still another aspect of the present invention, an apparatus is provided for detecting a fabrication apparatus generating a wafer failure using process history information. The apparatus includes a section setting unit providing a plurality of sections in each of wafers, an input unit to input a lot ID of a target lot, a wafer ID extraction unit to extract a wafer ID of a target wafer among a plurality of wafers in the target lot from the lot ID and the process history information, a location information extraction unit to extract the location information of the failure in the target wafer found through a test, from the wafer ID and test information configured to extract a failure location information in the wafers, a wafer feature amount calculation unit to calculate a to-be-quantified first wafer feature amount corresponding to unevenness of the wafer failure distribution based on the sections for the target wafer, a lot feature amount calculation unit to calculate a first lot feature amount for the target lot from the first wafer feature amount calculated for the target wafer, a fabrication apparatus extraction unit to extract a fabrication process for the target lot and a fabrication apparatus used in that fabrication process from the process history information using the lot ID of the target lot as an extraction condition, a significant test unit conducting a significant test for the fabrication apparatus in each fabrication process based on the first lot feature amount, and an abnormal apparatus detection unit to detect the fabrication apparatus with a significant difference as a first abnormal apparatus.

According to further aspect of the present invention, a computer program product is provided for detecting a fabrication apparatus generating a wafer failure using process history information. The computer program includes an instruction to provide a plurality of sections in each of wafers, an instruction to input a lot ID of a target lot, an instruction to extract a wafer ID of a target wafer among a plurality of wafers in the target lot from the lot ID and the process history information, an instruction to extract the location information of the failure in the target wafer from the wafer ID and test information configured to extract a failure location information in the wafers, an instruction to calculate a to-be-quantified first wafer feature amount corresponding to unevenness of the wafer failure distribution based on sections for the target wafer, an instruction to calculate the first lot feature amount for the target lot from the first wafer feature amount calculated for the target wafer, an instruction to extract a fabrication process for the target lot and fabrication apparatuses used in the extracted fabrication process from the process history information using the lot ID of the target lot as an extraction condition, an instruction to carry out significant tests for fabrication apparatuses in the extracted fabrication process based on the first lot feature amount, and an instruction to detect a fabrication apparatus with a significant difference as a first abnormal apparatus.

BRIEF DESCRIPTION OF THE DRAWINGS

FIG. 11 shows a data structure of fabrication apparatus tested values of Example 1, which are used for a significant test;

FIG. 12 shows a data structure of tested values having provided a significant difference obtained through a significant test for a fabrication apparatus of Example 1;

FIG. 22 is a diagram showing data structure of lot feature amounts of Example 1;

FIG. 23 shows the data structure of tested values having provided a significant difference obtained through a significant test for a fabrication apparatus of Example 1;

FIG. 29 is a table showing whether or not the wafers of Example 2 resemble each other; and FIG. 30 is a table describing generation of similar wafer groups and failure categories of Example 2.

DETAILED DESCRIPTION OF THE INVENTION

Figure 1:
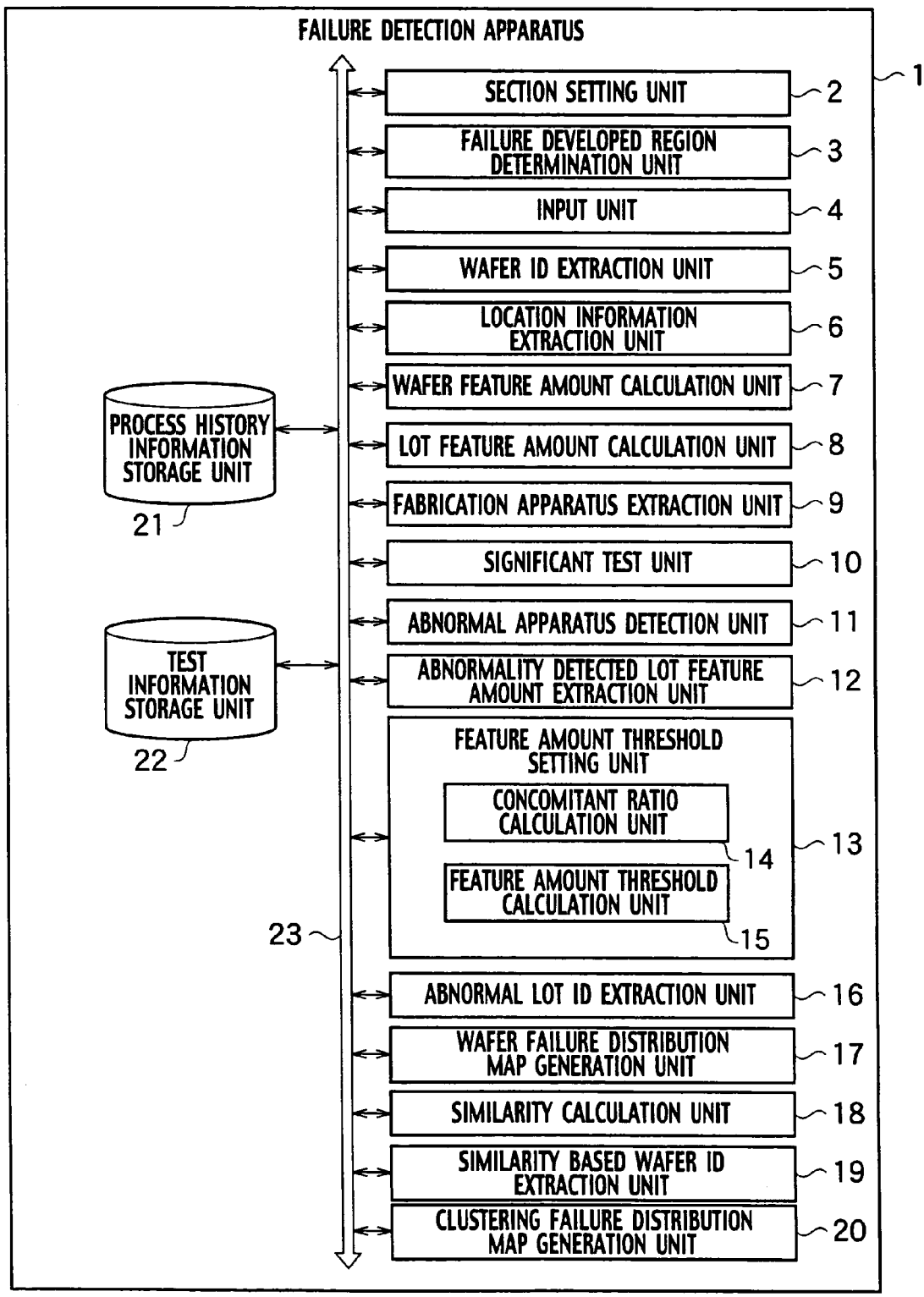
FIG. 1 shows a structure of a failure detection apparatus according to an embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Analytical Procedure for Determining Cause of Yield Decrease)

An analytical procedure for determining cause of yield decrease may include two steps: a first step of extracting a clustering failure, and a second step of categorizing the clustering failure.

The first step of extracting a clustering failure is described forthwith. Actual failure distributions are a mixture of random failures and clustering failures. The stacked failure distribution may be represented by a linear combination of a random failure Poisson distribution and a clustering failure negative binomial distribution. By finding a weight coefficient for each probability distribution, the degree of clustering failures developed in the wafer can be revealed. In this way, clustering failures can be extracted from failure distributions.

Next, categorization of clustering failures in the second step is described. It has been pointed out that failures emanating from a fabrication process and/or a fabrication apparatus leave a 'fingerprint' representing a wafer failure distribution. This means that when a failure develops in a certain fabrication process and/or a fabrication apparatus, a clustering failure unique thereto is included. Categorization of clustering failures for each fabrication process or each fabrication apparatus causing those failures is theoretically possible.

For LSI fabrication, for example, a fabrication history of wafers or wafer lots having the same clustering failures, which are categorized according to clustering failures, is reviewed and whether or not there is a common fabrication apparatus, which has executed a certain manufacturing process, is determined. This allows identification of a fabrication process and a fabrication apparatus that caused the failures during LSI fabrication. For this identification, clustering failures are digitized, and the digitized values are then subjected to an inter-fabrication apparatus significant test. These clustering failure digitized values are referred to as 'feature amounts'.

However, to identify a fabrication apparatus, which causes a failure, using an intra-apparatus significant test, each feature amount has to include only one type of cause of failure. In other words, it is necessary that when there are clustering failures with only a single failure cause or a specific fabrication apparatus, the corresponding feature amount should be large. If a feature amount changes due to multiple causes of failure is used, failure lots may disperse, and thus identification of a specific failure causing fabrication apparatus is difficult. Each feature amount needs to be defined to include only one failure cause. With unsuitably defined feature amounts, it is impossible to identify a failure causing apparatus. However, there are a variety of failure causes due to LSI fabrication processes. There are countless types of clustering failures emanating therefrom. Therefore, each feature amount corresponding to specific clustering failures needs a dedicated calculation method. With an embodiment of the present invention, suitable feature amounts allowing identification of a failure causing fabrication apparatus are generated.

(Failure Detection Apparatus)

As shown in FIG. 1, a failure detection apparatus 1 according to an embodiment of the present invention includes a section setting unit 2, a failure developed region determination unit 3, an input unit 4, a wafer ID extraction unit 5, a location information extraction unit 6, a wafer feature amount calculation unit 7, a lot feature amount calculation unit 8, a fabrication apparatus extraction unit 9, a significant test unit 10, an abnormal apparatus detection unit 11, an abnormality detected lot feature amount extraction unit 12, a feature amount threshold setting unit 13, an abnormal lot ID extraction unit 16, a wafer failure distribution map generation unit 17, a similarity calculation unit 18, a similarity-based wafer ID extraction unit 19, a clustering failure distribution map generation unit 20, a process history information storage unit 21, and a test information storage unit 22. The units 2 to 13 and 16 to 22 are connected to one another via bus lines 23. The process history information storage unit 21 and the test information storage unit 22 may be deployed outside of the failure detection apparatus 1. The feature amount threshold setting unit 13 includes a concomitant ratio calculation unit 14 and a feature amount threshold calculation unit 15. The failure detection apparatus 1 may be a computer, and, alternatively, may be implemented by making a computer execute a computer program.

(Failure Detection Method)

Figure 2:
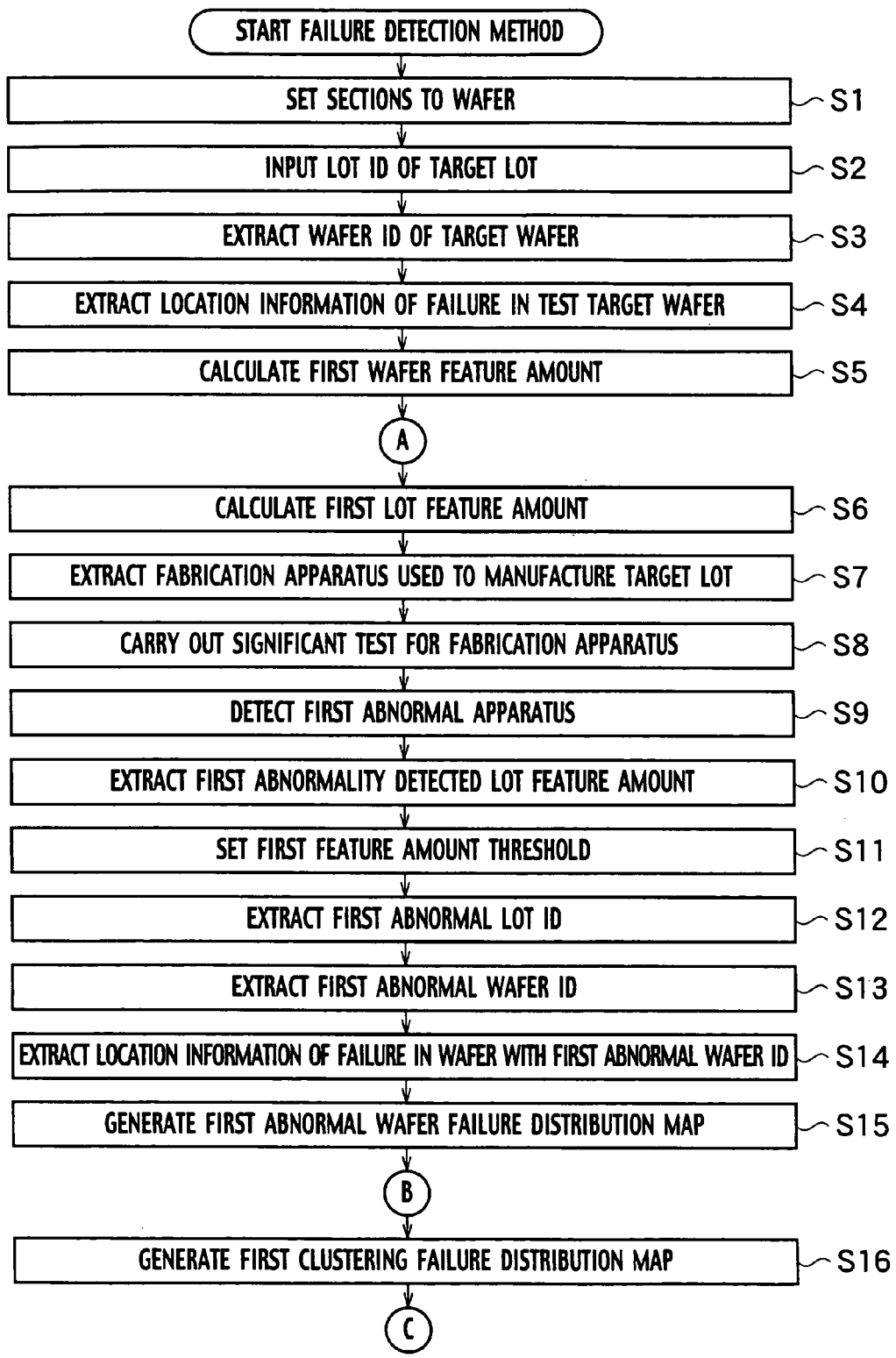
FIGS. 2 through 4 are flowcharts representing a failure detection method according to an embodiment.

As shown in FIG. 2, according to a failure detection method of an embodiment, in step S1, the section setting unit 2 sets multiple sections of a wafer. A section may be an overlapped region of a section formed by partitioning the entire circular wafer into sections, each section having a fixed angle, and a section formed by partitioning the same into sections based on the distance from the center of the wafer.

In step S2, the input unit 4 inputs the lot ID of a target lot.

In step S3, the wafer ID extraction unit 5 extracts the wafer ID of a target wafer in the target lot from the lot ID and process history information. The process history information allows extraction of the wafer ID of a wafer in a lot using the lot ID of that lot as an extraction condition. The process history information allows extraction of a lot fabrication process and a fabrication apparatus used for that process, by use of the lot ID of a lot as an extraction condition. The process history information is stored in the process history information storage unit 21.

In step S4, the location information extraction unit 6 extracts, the location information of failures found in a target wafer from wafer ID and test information. The test information allows extraction of location information of failures found in a wafer by each test using the wafer ID and the test name as extraction conditions. The test information is stored in the test information storage unit 22. It is preferable that the test be at least one of a DC test, a function test, or a margin test.

In step S5, the wafer feature amount calculation unit 7 calculates a to-be-quantified first wafer feature amount for the unevenness of the wafer failure distribution for each wafer section of each target wafer. It is preferable that the first wafer feature amount be a failure density, which is a failure development rate for each section, and failure unevenness among wafer sections represented by a CHI-SQUARE (,, 2)-tested value.

In step S6, the lot feature amount calculation unit 8 calculates a first lot feature amount for each lot from the first wafer feature amount calculated for each target wafer. It is preferable that the first lot feature amount be at least one of an average, a maximum value, or the top five average of the failure densities and also of the failure unevenness of the respective target wafers in a target lot, the inhomogeneity of failure distribution due to parity in wafer ID, or the inhomogeneity of failure distribution due to first/latter numbering of wafers.

In step S7, the fabrication apparatus extraction unit 9 extracts, from the process history information, the fabrication process for the target lot and the fabrication apparatus used for that process using the lot ID of the target lot as an extraction condition.

In step S8, the significant test unit 10 carries out an inter-fabrication apparatus significant test based on each first lot feature amount for each fabrication process. According to this inter-fabrication apparatus significant test, a CHI-SQUARE ($\chi^2$)-tested value for the fabrication apparatus for each fabrication process is calculated based on the first lot feature amount for the target lot processed by the fabrication apparatus.

In step S9, the abnormal apparatus detection unit 11 detects a fabrication apparatus having a significant difference in the inter-fabrication apparatus significant test as a first abnormal apparatus.

In step S10, the abnormality detected lot feature amount extraction unit 12 extracts the first lot feature amount, which has allowed detection of a first abnormal apparatus, as a first abnormality detected lot feature amount.

In step S11, the feature amount threshold setting unit 13 sets a first feature amount threshold for the first abnormality detected lot feature amount.

This setting of the first feature amount threshold allows calculation of a first concomitant ratio for each of a plurality of thresholds. This calculation is carried out by the concomitant ratio calculation unit 14, which adds a first ratio and a second ratio and then defines the resulting sum as that first concomitant ratio; wherein the first ratio denotes the ratio of the number of lots processed by the first abnormal apparatus to the number of lots processed by all fabrication apparatus used for the same fabrication process as the first abnormal apparatus when the first abnormality detected lot feature amount is less than a certain threshold; and the second ratio denotes the ratio of the number of the lots processed by other fabrication apparatus without the first abnormal apparatus used for the same fabrication process as the first abnormal apparatus to the number of the lots processed by all fabrication apparatus within the first abnormal apparatus used for the same fabrication process as the first abnormal apparatus when the first abnormality detected lot feature amount is larger than that certain threshold. The feature amount threshold calculation unit 15 then calculates the threshold that allows the first concomitant ratio to be a minimum, which is then defined as the first feature amount threshold.

In step S12, the abnormal lot ID extraction unit 16 extracts the lot ID of the target lot with a first abnormality detected lot feature amount larger than the first feature amount threshold, which is then defined as a first abnormal lot ID.

In step S13, the wafer ID extraction unit 5 extracts from the process history information, the wafer ID of a wafer in the lot with the first abnormal lot ID, which is then defined as a first abnormal wafer ID.

In step S14, the location information extraction unit 6 extracts from the test information, the failure location information of the first abnormal wafer ID, which is provided by testing based on the first abnormality detected lot feature amount.

In step S15, the wafer failure distribution map generation unit 17 generates from the location information of failures existing in the wafer with the first abnormal wafer ID, multiple wafer failure distribution maps as first abnormal wafer failure distribution maps.

In step S16, the clustering failure distribution map generation unit 20 generates a first clustering failure distribution map based on the first abnormal wafer failure distribution maps. The first clustering failure distribution map may be generated by overlapping the first abnormal wafer failure distribution maps and integrating the distributions thereof, or by calculating the logical sum (OR) of the failures in wafers existing in the same location in the first abnormal wafer failure distribution map.

Figure 3:
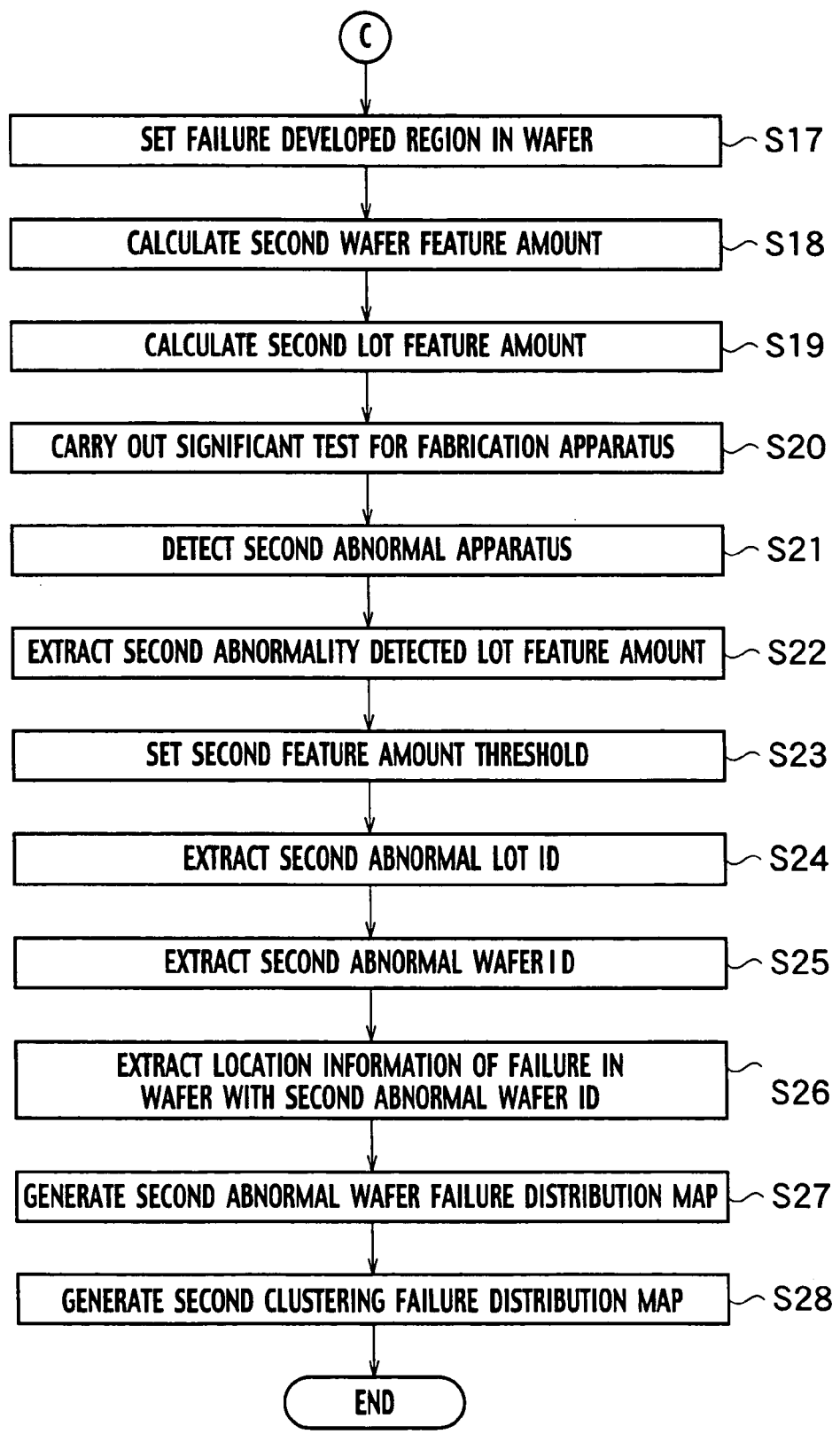

In step S17 of FIG. 3, the failure developed region determination unit 3 identifies failure developed regions in the target wafer, each having a failure density in the first clustering failure distribution map which is higher than each density threshold of multiple density thresholds.

In step S18, the wafer feature amount calculation unit 7 calculates for each target wafer, a to-be-quantified second wafer feature amount for the unevenness of the wafer failure distribution based on those failure developed regions. It is preferable that the second wafer feature amount is a failure density, which is a rate of failures developed in the failure developed regions, and unevenness of the wafer failures in the failure developed regions, which can be represented by a CHI-SQUARE ($\chi^2$)-tested value.

In step S19, the lot feature amount calculation unit 8 calculates a second lot feature amount for each target lot from the second wafer feature amounts calculated for each target wafer. It is preferable that the second lot feature amount is at least one of the average, the maximum value, or the top five average of the failure densities and also of the failure unevenness of the respective target wafers in a target lot, the inhomogeneity of failure distribution due to parity in wafer ID, or the inhomogeneity of failure distribution due to first/latter numbering of wafer IDs.

In step S20, the significant test unit 10 carries out an inter-fabrication apparatus significant test based on each second lot feature amount for each fabrication process. According to this inter-fabrication apparatus significant test, it is preferable that a CHI-SQUARE ($\chi^2$)-tested value for the fabrication apparatus for each fabrication process is calculated based on the second lot feature amount for the target lot processed by fabrication apparatus.

In step S21, the abnormal apparatus detection unit 11 detects a fabrication apparatus with a significant difference as a second abnormal apparatus.

In step S22, the abnormality detected lot feature amount extraction unit 12 extracts the second lot feature amount, which has allowed detection of a second abnormal apparatus, which is then defined as a second abnormality detected lot feature amount.

In step S23, the feature amount threshold setting unit 13 sets a second feature amount threshold for the second abnormality detected lot feature amount. This setting of the second feature amount threshold allows calculation of a second concomitant ratio for each of multiple thresholds. It is preferable that this calculation is carried out by the concomitant ratio calculation unit 14, which adds the first ratio and the second ratio and then defines the resulting sum as that first concomitant ratio; wherein the first ratio denotes the ratio of the number of lots processed by the second abnormal apparatus to the number of lots processed by all fabrication apparatus used for the same fabrication process as the second abnormal apparatus when the second abnormality detected lot feature amount is less than a certain threshold; and the second ratio denotes the ratio of the number of the lots processed by the other fabrication apparatus used for the same fabrication process as the second abnormal apparatus to the number of lots processed by all fabrication apparatus used for the same fabrication process as the second abnormal apparatus when the second abnormality detected lot feature amount is larger than that certain threshold. It is preferable that the feature amount threshold calculation unit 15 then calculates a threshold that allows the second concomitant ratio to be a minimum, second feature amount threshold.

In step S24, the abnormal lot ID extraction unit 16 extracts the lot ID of the target lot with a larger second abnormality detected lot feature amount than the second feature amount threshold, which is then defined as a second abnormal lot ID.

In step S25, the wafer ID extraction unit 5 extracts from the process history information, the wafer ID of a wafer in the lot with the second abnormal lot ID, which is then defined as a second abnormal wafer ID.

In step S26, the location information extraction unit 6 extracts the location information of failures in the wafer with the second abnormal wafer ID from the test information, which is provided through a test using the second abnormality detected lot feature amount.

In step S27, the wafer failure distribution map generation unit 17 generates from the location information of failures in a wafer with the second abnormal wafer ID, multiple wafer failure distribution maps as second abnormal wafer failure distribution maps.

In step S28, the clustering failure distribution map generation unit 20 generates a second clustering failure distribution map based on the second abnormal wafer failure distribution maps. The second clustering failure distribution map may be generated by overlapping the second abnormal wafer failure distribution maps and then integrating them, or by calculating the logical sum (OR) of the wafer failures that develop at the same location in the second abnormal wafer failure distribution map.

At this point, description of the failure detection method is completed. Note that steps S6 through S15 between A and B in FIG. 2 of the failure detection method may be replaced with steps S31 through S34 between A and B in FIG. 4.

For example, in step S31, the similarity calculation unit 18 represents how wafers resemble each other in terms of the first wafer feature amount as the degree of similarity.

In step S32, the similarity-based wafer ID extraction unit 19 groups the wafers based on whether or not the degree of similarity is greater than a predetermined threshold, and then extracts them as the first abnormal wafer ID.

In step S33, the location information extraction unit 6 extracts the location information of failures with the first abnormal wafer ID from the test information.

In step S34, the wafer failure distribution map generation unit 17 generates from the location information of failures in a wafer with the first abnormal wafer ID, multiple wafer failure distribution maps as the first abnormal wafer failure distribution maps. Hereafter, this process returns to B in FIG. 2 in which processing in step S16 and subsequent steps are then carried out.

The failure detection method can be represented by a failure detection program, which can be executed by a computer. The wafer failure detection method can be implemented by making the computer execute this failure detection program.

EXAMPLE 1

In Example 1, the failure detection apparatus in FIG. 1 and the failure detection method in FIGS. 2 and 3 are described. In Example 1, an inter-fabrication apparatus significant test is carried out based on several thousands of systematically defined first lot feature amounts. If there is a first lot feature amount that has allowed detection of an abnormal apparatus, lots with larger first lot feature amounts are extracted, a clustering failure common to those lots is identified, and correspondences between the abnormal apparatus and clustering failure are established. Wafer failure distribution is represented by many numerical value groups, and wafers with similar failure distributions are automatically extracted.

Figure 5:
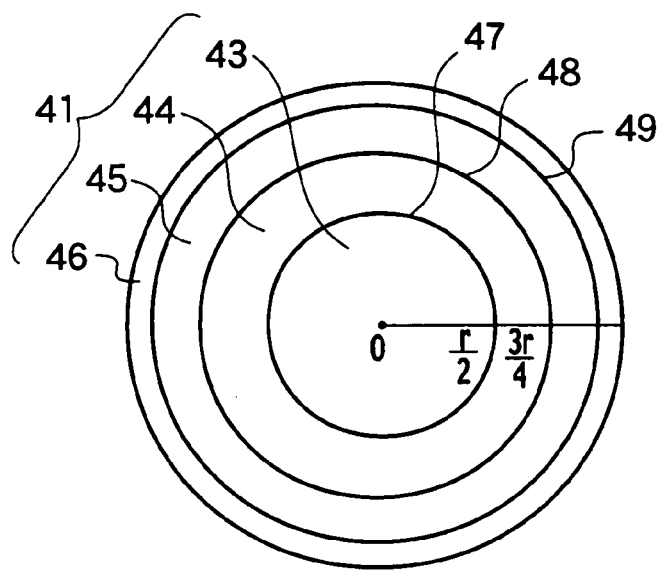
FIGS. 5 through 9 show wafer representation regions for describing sections in Example 1.

In step S1, a wafer is partitioned into multiple sections. Categorizing the clustering failures is carried out by quantifying the position of failures centralized within each wafer. Here, 'failure' denotes a failure bit in the case of memory products, or a failure chip in the case of logical products. To begin with, a wafer representation region 41 is partitioned into multiple sections. As shown in FIG. 5, a boundary line 47 is provided at a distance (½)r from the center of the wafer along the radius; a boundary line 48 is provided at a distance (¾)r from the center of the wafer along the radius; and a boundary line 49 is provided so that chips deployed in the outermost region of the wafer that contact the wafer edge can be separate from other chips deployed radially inward of the wafer edge; where r denotes the radius of the wafer. These three boundary lines 47 through 49 partition the wafer representation region 41 into four ring-shaped regions 43 through 46.

Figure 6:
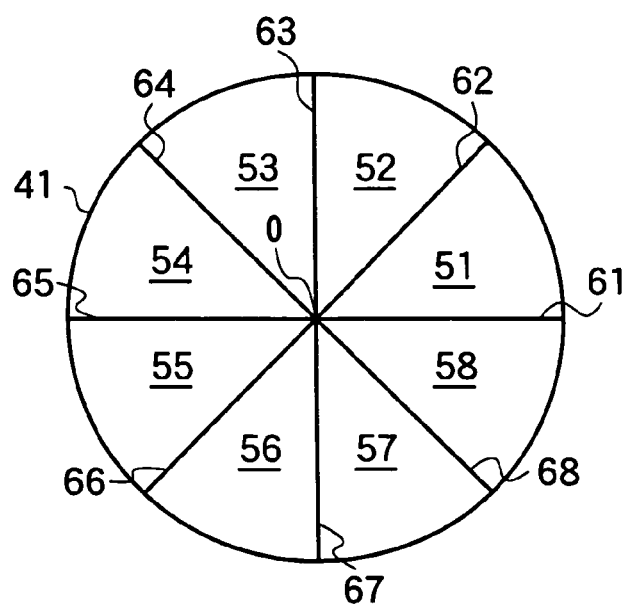

Next, as shown in FIG. 6, eight boundary lines 61 through 68 are provided so that the wafer can be divided for every 45 degree angle. These eight boundary lines 61 through 68 partition the wafer representation region 41 into eight fan-shaped sections 51 through 58 each having a fixed angle.

Figure 7:
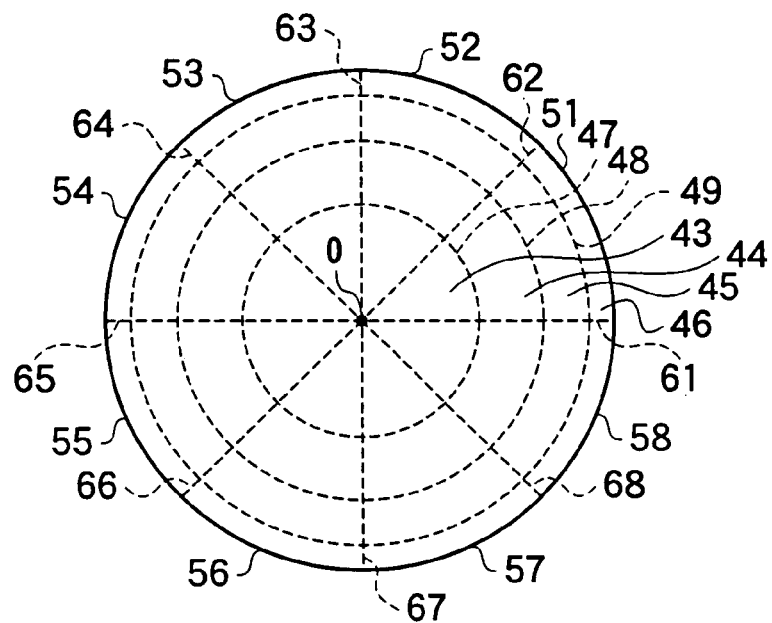
Figure 8:
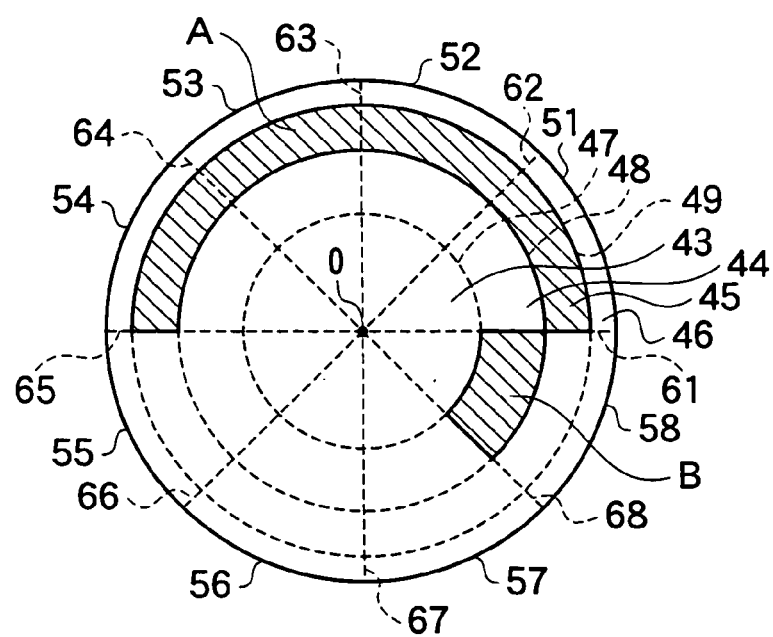

As shown in FIG. 7, sections 43 through 46 partitioned in FIG. 5 and sections 51 through 58 partitioned with a fixed angle in FIG. 6 are combined into a total of 150 defined sections. For example, as shown in FIG. 8, section A is defined as the logical product of the section 45 and the sections 51 through 54 partitioned with a fixed angle. Section B is defined as the logical product of the section 44 and the section 58 partitioned with a fixed angle. Similarly, other sections can be defined as the logical product of the sections 43 through 46 and the sections 51 through 58 partitioned with a fixed angle.

In step S2, the lot ID of a target lot for a test is input.

Figures 9, 10:
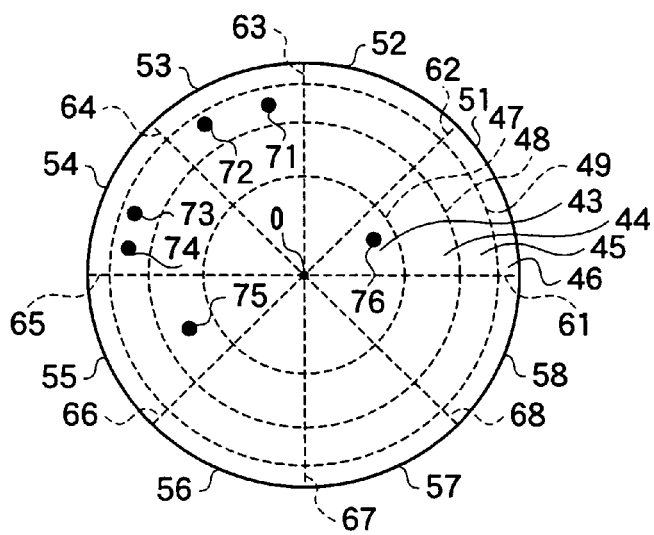
FIG. 10 shows a data structure of the lot feature amounts of Example 1.

In step S3, the wafer ID of the target wafer within the target lot is extracted from the lot ID and process history information. In step S4, the location information of failures in the target wafer is extracted from the wafer ID and test information. For example, if the target wafer configures memory products, the locations of failures 71 through 76 in the wafer are extracted for each target wafer as shown in FIG. 9.

In step S5, a to-be-quantified first wafer feature amount for the unevenness of the wafer failure distribution for each wafer section is calculated for each target wafer. The failure density and the inhomogeneity of failure distribution are calculated as the first wafer feature amounts.

The number of failures is counted for each section so as to calculate the failure density. For example, in the case of memory products, the failure density in section A of FIG. 8 of a wafer that has the failure distribution shown in FIG. 9 is 4/20=0.2, if the failure bits 71 through 74 are four bits and the total number of bits included in section A is twenty.

Next, the inhomogeneity of failure distribution in each section is calculated for all sections, respectively. A CHI-SQUARE ($\chi^2$) value is used to represent the inhomogeneity of failure distribution. That is, the inhomogeneity of failure distribution $\chi^i$ in section i is represented by Equations 1 through 3, $$\chi_i = sgn(d_1 - d_2) \cdot \frac{(n_{f1} - e_1)^2}{e_1} + \frac{(n_{f2} - e_2)^2}{e_2} \quad (1)$$

$$e_1 = n_{fa} \frac{n_{l1}}{n_{l1} + n_{l2}} \quad (2)$$

$$e_2 = n_{fa} \frac{n_{l2}}{n_{l1} + n_{l2}} \quad (3)$$

where nf1 denotes the number of failures in section i, nf2 denotes the number of failures in sections other than the section i, nfa denotes the number of failures in the entire wafer, nl1 denotes the number of all bits in the section i, nl2 denotes the number of all bits in the sections other than the section i, d1 denotes the failure density in the section i, and d2 denotes the failure density in the sections other than the section i. In addition, Sgn(d1−d2) denotes a sign of d1−d2. If (d1−d2) is positive, Sgn(d1−d2) is +1, and if (d1−d2) is negative, Sgn(d1−d2) is −1. Note that a memory product is assumed in the above description; alternatively, in the case of a logical product, the number of bits should be replaced with the number of chips. The greater the number of failures unevenly distributed in section i, the greater the inhomogeneity of failure distribution $\chi^i$. In addition, the more failures exist, the higher the failure density becomes. Therefore, in the case of an uneven distribution with few failures in the entire wafer but many failures in a to-be-calculated section, the inhomogeneity of failure distribution is positive. In contrast, in the case of an uneven distribution with many failures in the entire wafer but few failures in a to-be-calculated section, the inhomogeneity of failure distribution is negative.

In addition, various electrical tests are carried out for testing wafers. For example, a DC test to determine if the current consumption of the LSI is a normal value, a function test to determine if LSI functions are normal, and a margin test to determine if the operating time and the like of the functioning LSI fall within a specific range are included. The failure density and the inhomogeneity of failure distribution are tested for the failures found through each electrical test. In Example 1, the failure density and the inhomogeneity of failure distribution are calculated for each of those three electrical tests.

In step S6, a first lot feature amount for each target lot is calculated from the first wafer feature amount calculated for each target wafer. In the LSI fabrication process, processing in units of lots is carried out, where twenty-five wafers form a single lot, for example. The first wafer feature amounts such as the failure density and the inhomogeneity of failure distribution calculated in units of wafer is converted into the first lot feature amounts. In Example 1, the following five calculation methods are employed for conversion of failure density and inhomogeneity of failure distribution into the first lot feature amounts.

(1) Average (2) Maximum value (3) Top five wafer averages (4) Degree of failures centralized in even numbered wafers (inhomogeneity of failure distribution due to parity in wafer number)

(5) Degree of failures centralized in wafers in the first half of each lot (e.g., from #1 to #12) (inhomogeneity of failure distribution due to first/latter numbering of wafers)

Those calculated values are the first lot feature amounts.

The number of the first lot feature amounts is the product of one hundred fifty types of sections, three types of electrical tests, five lot feature amount calculation methods, and two wafer feature amount calculation methods, which represents a total of 4500 types. A total of 4500 types of first lot feature amounts may be systematically defined. A table with 4500 columns as shown in FIG. 10 may be generated by calculating the first lot feature amounts for all lots.

In step S7, a fabrication process for the target lot and a fabrication apparatus used in that process are extracted from the process history information using the lot ID of the target lot as an extraction condition.

In step S8, an inter-fabrication apparatus significant test is carried out for each fabrication process based on each first lot feature amount. The inter-apparatus feature amount significant test is carried out based on each of the 4500 types of feature amounts while referencing the process history information of each lot processed by fabrication apparatuses. In Example 1, a CHI-SQUARE ($\chi^2$) test is employed. For example, a CHI-SQUARE ($\chi^2$)-tested value for each feature amount and each process is calculated for each apparatus, and the results are summarized in a table shown in FIG. 11. For example, in fabrication process 1, lots are processed by not only a fabrication apparatus A but also by other fabrication apparatuses. The significant test is carried out to determine whether there is a significant difference between the feature amounts of lots processed by the fabrication apparatus A and those processed by the other fabrication apparatuses. Note that a sign is attached to the tested value, which is positive when most of the values of the feature amounts are high, and is negative when most of the values are low. Note that in Example 1, it is assumed that the greater the number of existing failures, the greater the values of the feature amounts. In contrast, in the case of the feature amounts being defined such that the greater the number of failures, the lower the values of the feature amounts, the attached sign should be reversed. Accordingly, when there are few failures in the entire wafer, but many failures in a to-be-tested section, the tested value is positive. In contrast, if there are many failures in the entire wafer, but few failures in a to-be-tested section, the tested value is negative. At the same time, the name of the fabrication apparatus that has the highest tested value is recorded for each fabrication process.

In step S9, the test results shown in the table of FIG. 11 are sorted in decreasing order of the tested values, as shown in FIG. 12. In Example 1, the range in the value of each feature amount is divided into six sections, and the inter-fabrication apparatus significant test is carried out, respectively. In this case, if the tested value is 11 or greater, the difference is determined to be statistically significant. The types of feature amounts, process names, and apparatus names that have provided a tested value of 11 or greater are detected. For example, it is understood from FIG. 12 that when a fabrication apparatus M is used to process lots in fabrication process 72, a feature amount corresponding to the case of having inhomogeneity of failure distribution and parity in intra-lot wafer number found through a function test for section 32 provides the greatest significant difference. Similarly, it is also understood that when a fabrication apparatus P is used to process lots in fabrication process 146, the feature amount corresponding to the average of intra-lot wafer failure densities found through a margin test for section 98 provides a significant difference. In addition, it is also understood that when a fabrication apparatus Q is used to process lots in fabrication process 187, the feature amount corresponding to the maximum value of intra-lot wafer failure densities found through a DC test for section 127 provides a significant difference. These three fabrication apparatuses M, P, and Q having significant differences are detected as first abnormal apparatuses.

In step S10, the first lot feature amount corresponding to the case of having failures centralized in section 32, which has allowed detection of the first abnormal apparatus M through a function test, and also having parity in intra-lot wafer number is extracted as a first abnormality detected lot feature amount. Similarly, the first lot feature amount corresponding to the average of intra-lot wafer failure densities found through a margin test for section 98, which has allowed detection of the first abnormal apparatus P, is extracted as a first abnormality detected lot feature amount. In addition, the first lot feature amount corresponding to the maximum value of intra-lot wafer failure densities provided through a DC test for section 127, which has allowed detection of the first abnormal apparatus Q, is extracted as a first abnormality detected lot feature amount.

Figure 13:
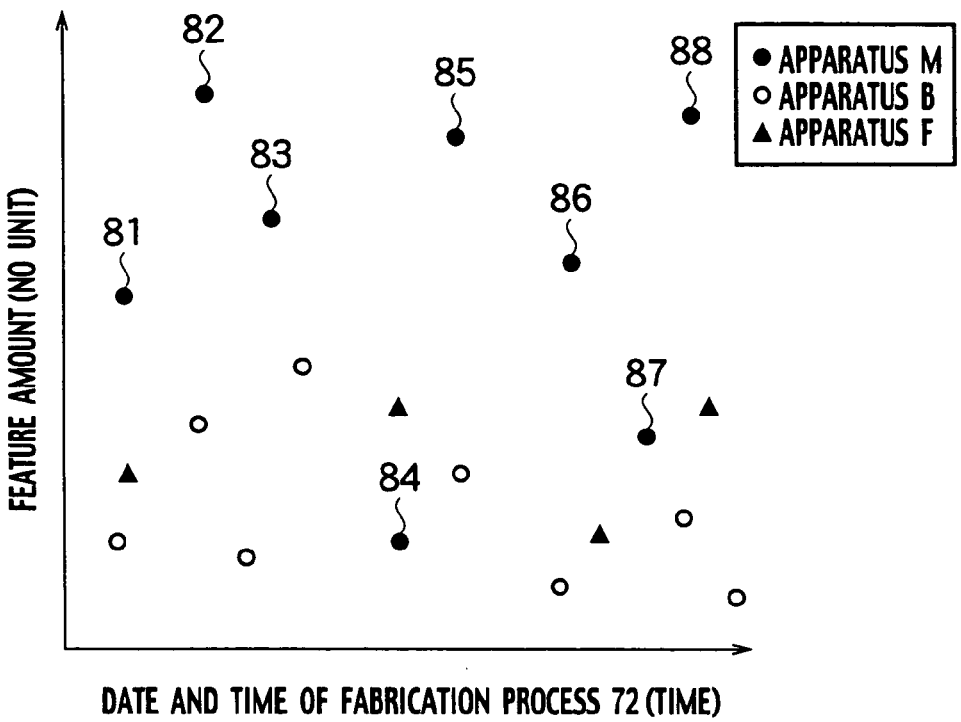
FIG. 13 is a graph showing the relationship between each lot processed date and time of a fabrication process 72 and corresponding lot feature amount for Example 1.

As shown in FIG. 13, in step S11, the first abnormality detected lot feature amounts obtained through fabrication process 72 are plotted based on lot processing time, and the first abnormal apparatus M, which is used to process lots, and the two fabrication apparatuses B and F, which are used in parallel with the first abnormal apparatus M during the fabrication process 72, are compared. The first abnormality detected lot feature amounts for lots processed by the first abnormal apparatus M tend to be greater than those processed by the fabrication apparatuses B and F throughout the entire process period.

Figure 14:
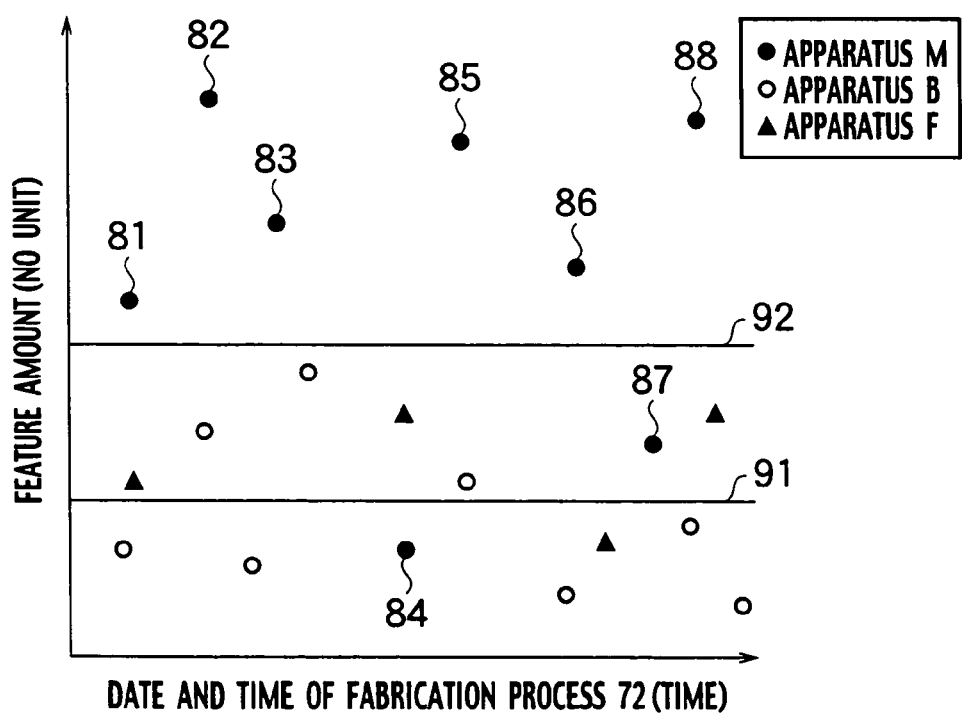
FIG. 14 is a graph showing the relationship between each lot processed date and time of fabrication process 72 and corresponding lot feature amount for describing the concomitant ratio for Example 1.

As shown in FIG. 14, to begin with, a threshold 91 is set. A first concomitant ratio or the sum (0.61) of a first ratio (1/7) and a second ratio (6/13) is then calculated; where the first ratio is a ratio of the single lot #84 processed by the first abnormal apparatus M to the number of lots processed by all fabrication apparatuses M, B, and F used in the same fabrication process 72 as the first abnormal apparatus M, wherein those lots have the first abnormality detected lot feature amount in fabrication process 72 being no greater than a threshold 91; and the second ratio is a ratio of the number of lots processed by the fabrication apparatuses B and F used in the same fabrication process 72 as the first abnormal apparatus M to the number of lots processed by all fabrication apparatuses M, B, and F used in the same fabrication process 72 as the first abnormal apparatus M, wherein those lots have the first abnormality detected lot feature amount that equal to or greater than the threshold 91.

Figure 15:
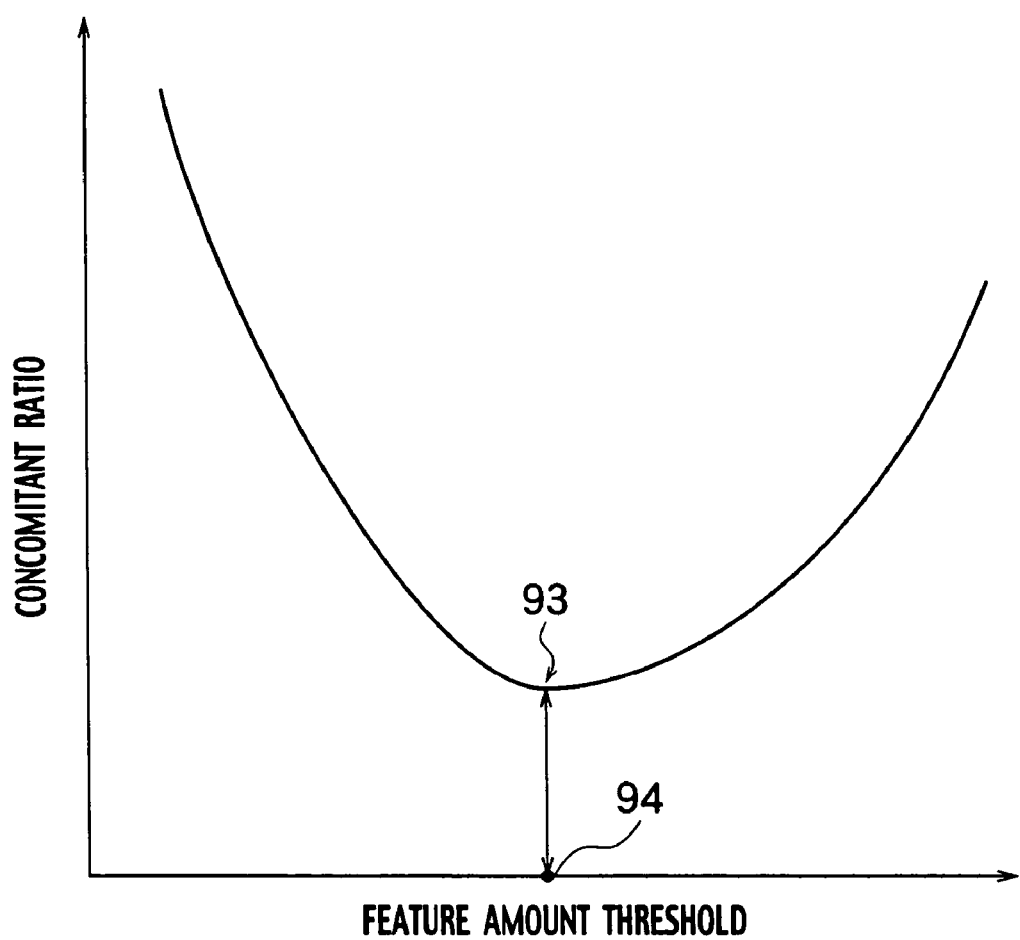
FIG. 15 is a graph showing the relationship between the lot feature amount and the concomitant ratio for Example 1.

A threshold for the first abnormality detected lot feature amount is calculated to be the first feature amount threshold such that the first concomitant ratio can be a minimum. In other words, a threshold 92 differing from the threshold 91 is set. In this case, the number of lots processed by the first abnormal apparatus M, which is lower than the threshold 92, is a total of two (lot #84 and #87). The sum (0.14) of a first ratio (2/14) and a second ratio (0/6) is calculated to be the first concomitant ratio by finding the first ratio and the second ratio in the same way as in the case of the threshold 91. In this manner, setting various thresholds 91, 92, . . . , and calculating the first concomitant ratio for each of the thresholds 91, 92, . . . , the concomitant ratio is expressed as a function of the thresholds 91, 92, . . . . The concomitant ratio represents the degree to which the normal fabrication apparatuses B and F cannot be separated from the first abnormal fabrication apparatus based on the thresholds 91, 92, . . . . Calculating concomitant ratios while shifting the thresholds 91, 92, . . . throughout the entire range of the first abnormality detected lot feature amounts shows that the concomitant ratio has a local minimum value 93 as shown in FIG. 15. The value of the first abnormality detected lot feature amount corresponding to the local minimum value 93 is set as a first feature amount threshold 94.

In step S12, the lot IDs 81 through 83, 85, 86, and 88 in FIG. 14, for example, of target lots with larger first abnormality detected lot feature amounts than the first feature amount threshold 94 are extracted as first abnormal lot IDs.

In step S13, the wafer IDs of wafers W1 through W8 within a lot with the first abnormal lot ID are extracted from the process history information, and then defined as first abnormal wafer IDs.

In step S14, the location information of failures in the target wafer with the first abnormal wafer ID, which are found through a test based on the first abnormality detected lot feature amount obtained during fabrication process 72, is extracted from the test information.

Figure 16:
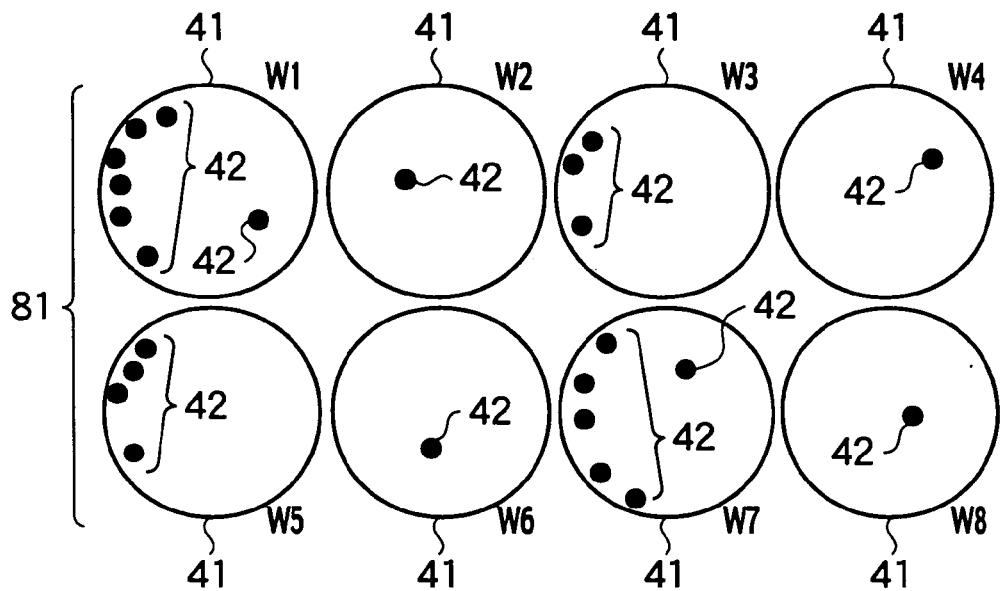
FIGS. 16 and 17 are wafer failure distribution maps for a lot with an abnormal lot ID of Example 1.
Figure 17:
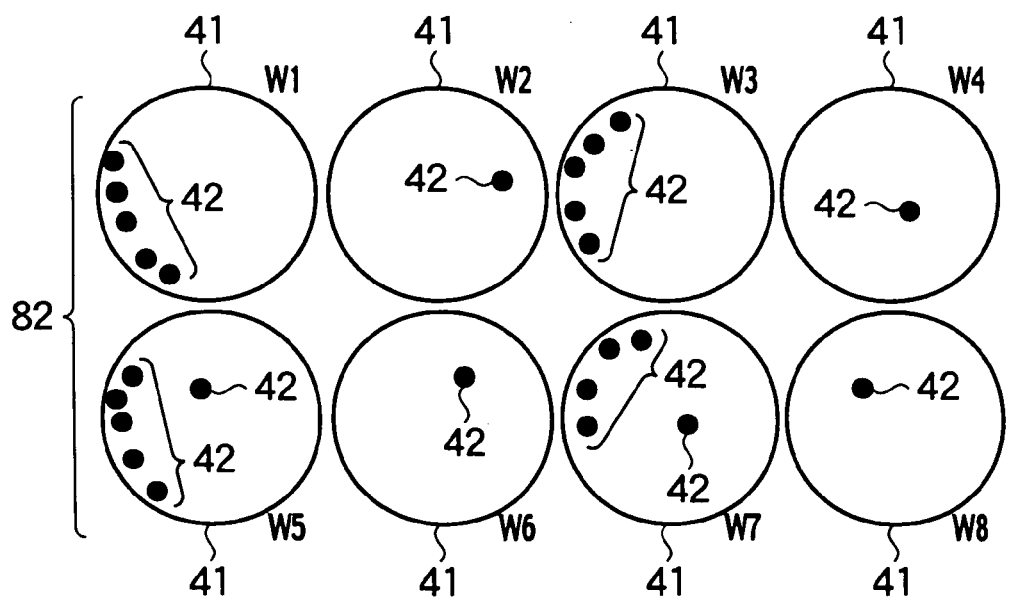

In step S15, multiple wafer failure distribution maps are generated for the wafers W1 through W8 in lot #81 from the location information of failures with the first abnormal wafer ID as shown in FIG. 16. As with the first abnormal lot feature amount in fabrication process 72 characterized by parity in wafer number, the failure distribution maps for the wafers W1 through W8 in lot #81 are also characterized by parity in wafer number. The failure distribution maps for the wafers W1, W3, W5, and W7 are considered as the first abnormal wafer failure distribution maps including clustering failures. Similarly, multiple wafer failure distribution maps are generated for the wafers W1 through W8 in lot #82 as shown in FIG. 17, and the failure distribution maps for the wafers W1, W3, W5, and W7 are considered as the first abnormal wafer failure distribution maps including clustering failures. Similarly, multiple first abnormal wafer failure distribution maps are generated for the wafers W1 through W8 in lots #83, #85, #86, and #88, respectively.

Figure 18:
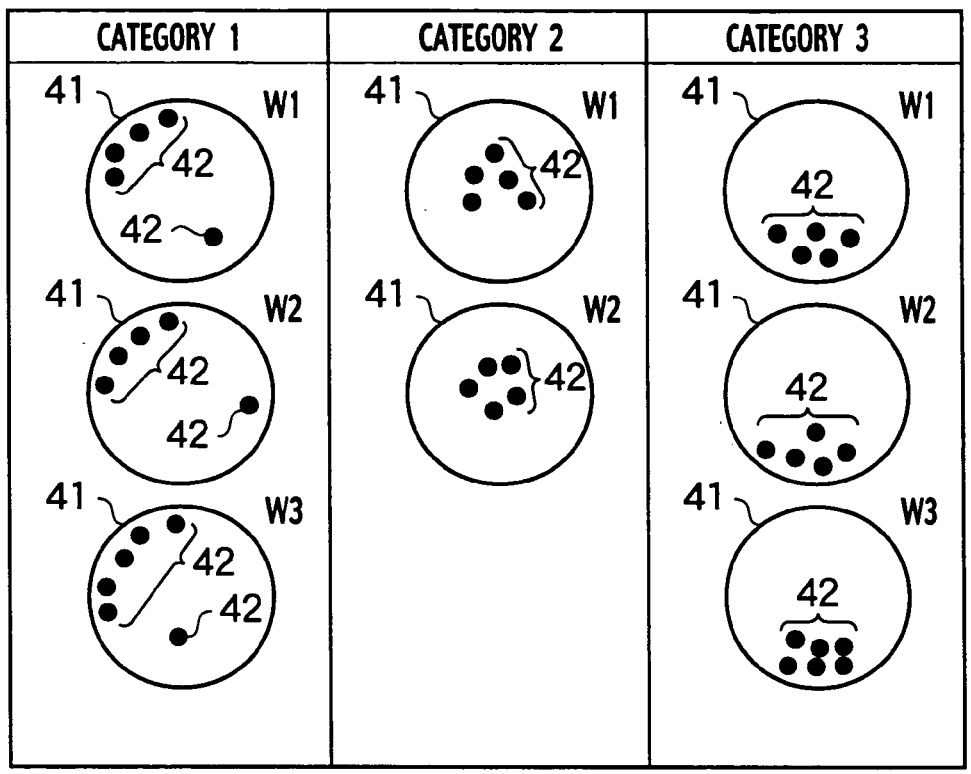
FIG. 18 is a table showing categorized failure distribution maps for wafers with abnormal wafer IDs for each abnormal apparatus of Example 1.

As shown in FIG. 18, the first abnormal wafer failure distribution maps corresponding to the first abnormal lot feature amount in fabrication process 72 are categorized into category 1. Similarly, in steps S11 through S15, the first abnormal wafer failure distribution maps corresponding to the first abnormal lot feature amount in fabrication process 146 are generated, and categorized into category 2. The first abnormal wafer failure distribution maps corresponding to the first abnormal lot feature amount in fabrication process 187 are generated, and categorized into category 3. The first abnormal wafer failure distribution maps, the lot IDs, and the wafer IDs of the wafers having the same clustering failures are shown for each category. The wafers in category 1 have failure representation regions 42 centralized at the upper left edge. The wafers in category 2 have the failure representation regions 42 centralized in the central region. The wafers in category 3 have the failure representation regions 42 centralized in the lower region.

Figure 19:
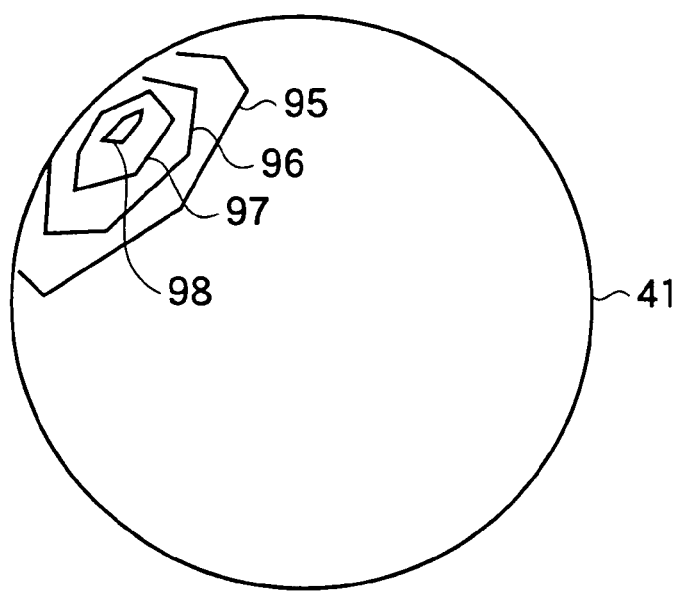
FIG. 19 is a clustering failure distribution map of Example 1.

In step S16, the first wafer failure distribution maps of the wafers W1 through W3 in category 1 of FIG. 18 are overlapped, and a total number of failure bits falling within each minute region with an appropriate size (which is called a 'segment'), is counted. The first clustering failure distribution maps having a certain failure distribution common to the multiple first abnormal wafer failure distribution maps as shown in FIG. 19 are generated. It is understood from failure density contour lines 95 through 98 that more failure bits tend to develop at the upper left edge of each wafer. As a result, it is understood that the first abnormal apparatus M in fabrication process 72 causes many failures at the upper left edge of each wafer. The first clustering failure distribution map is a stacked failure distribution map, which is called a stacked map. In the case of memory products, the logical sum (OR) of fail bit maps may be used for overlapping. In the case of logical products, the ratio of failure chips for each intra-wafer segment may be calculated.

Figure 20:
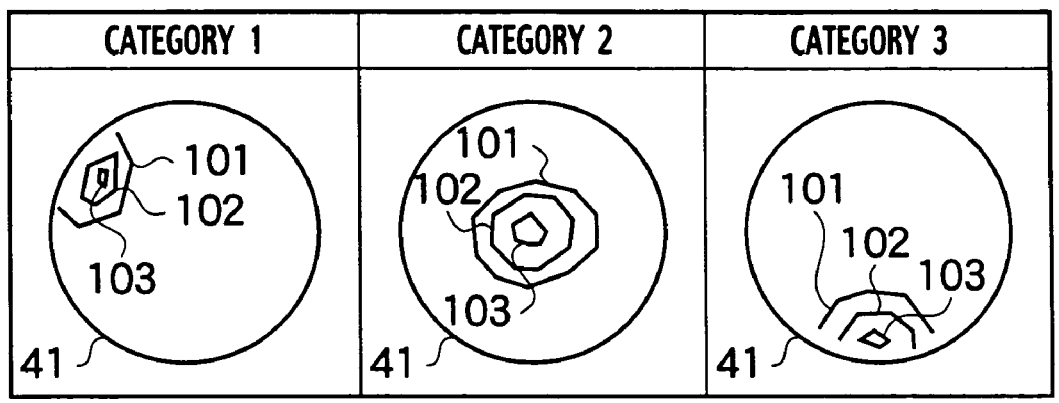
FIG. 20 is clustering failure distribution maps for each abnormal apparatus of Example 1.

Similarly, the first clustering failure distribution maps having the same failure distribution as the multiple first abnormal wafer failure distribution maps are generated for the other categories 2 and 3 in FIG. 18, which are indicated by failure contour lines 101 through 103 as shown in FIG. 20. This allows determination of the location of the failures that are caused by the first abnormal apparatuses P and Q in the wafer. The categorization results of the first clustering failure distribution maps are shown for each category. The wafers in category 1 have failures centralized at the upper left edge thereof. The wafers in category 2 have failures centralized at the center thereof. The wafers in category 3 have failures centralized in the lower portion thereof.

The foregoing process allows establishment of correspondences between a clustering failure and a first abnormal apparatus by carrying out the inter-fabrication apparatus significant test based on a systematically generated feature amount and finding a stacked map of a lot having a high feature amount that has allowed detection of the first abnormal apparatus with a significant difference. Conventionally, a clustering failure has been recognized first, and a fabrication apparatus that causes the failure is then identified based on a certain feature amount, which is obtained by digitized clustering failures. However, if a digitizing method is not appropriate, the fabrication apparatus that causes a failure cannot be identified. With the method in Example 1, since a large number of feature amounts are systematically defined, there is a high possibility of an appropriate feature amounts included therewithin, resulting in improvement in the detection ratio of an abnormal apparatus.

The feature amounts are re-generated using the clustering failure categorization results to improve the detection rate of abnormal apparatuses. The case of using the results of the inter-fabrication apparatus significant test as categorization results is described below.

Figure 21:
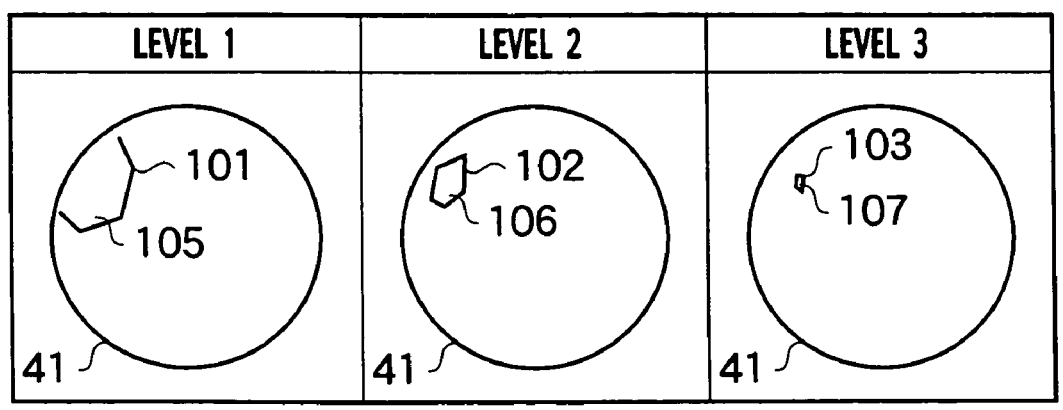
FIG. 21 is a diagram showing a wafer representation region for describing a failure developed region of Example 1.

In step S17, assuming the failure density contour lines 101 through 103 in the first clustering failure distribution map in category 1 in FIG. 20 to be the density thresholds, failure developed regions with higher failure densities than each of those density thresholds are set to the target wafer. For example, as shown in level 1 of FIG. 21, a region with a higher failure density than that indicated by the failure density contour line 101 is set as the failure developed region 105. Similarly, in level 2, a region with a higher failure density than that indicated by the failure density contour line 102 is set as the failure developed region 106. In addition, in level 3, a region with a higher failure density than that indicated by the failure density contour line 103 is set as the failure developed region 107. It is found that as the level increases from level 1 to level 3, a higher level failure developed region is set within the low level failure developed region.

Furthermore, failure developed regions are similarly set for categories 2 and 3. Note that levels 1 through 3 are density threshold setting levels, where in Example 1, level 1 is 10%, level 2 is 30%, and level 3 is 50% relative to the maximum wafer failure density. The absolute failure density may be used as the density threshold. It is found that the contour line patterns represent the features in each category.

In step S18, a to-be-quantified second wafer feature amount for the unevenness of the wafer failure distribution is calculated for each target wafer based on failure developed regions. Failure density and inhomogeneity of failure distribution are calculated as the second wafer feature amounts in the same way as that for the first wafer feature amounts. There is a difference between the second wafer feature amounts and the first wafer feature amounts in that failure developed regions divided into categories 1 through 3 and levels 1 through 3 are used in place of sections. Note that the failure developed regions are set using the stacked maps of the failure distributions in categories 1 through 3 for each of categories 1 through 3. The electrical tests are different for each category, that is, the function test is performed for category 1, the margin test is performed for category 2, and the DC test is performed for category 3. The stacked distribution of failure distributions in categories 1 through 3 is generated to systematically generate many feature amounts.

In step S19, the second lot feature amount for each target lot is calculated from the second wafer feature amount calculated for each target wafer. As shown in FIG. 22, in comparison with FIG. 10, there is a difference between the second lot feature amounts and the first lot feature amounts in that failure developed regions divided into categories 1 through 3 and levels 1 through 3 are used in place of sections. Accordingly, the total number of the second lot feature amounts varies depending on the number of failure developed regions divided into categories 1 through 3 and levels 1 through 3.

In step S20, the inter-fabrication apparatus significant test in each fabrication process is carried out based on each of the second lot feature amounts with the same procedure as step S8 using the fabrication apparatus extracted in step S7.

In step S21, the test results shown in the table of FIG. 22 are sorted in decreasing order of the tested values as shown in FIG. 23 and then output. It is found in column C of FIG. 23 that the fabrication apparatus M and the fabrication process 72 are detected as with FIG. 12 and step S8. It is found that when the fabrication apparatus M is used to process lots in fabrication process 72, the feature amounts corresponding to the case of having inhomogeneity of failure distribution and parity in the intra-lot wafer number found through a function test for failure developed regions in level 2 of category 1 provide the greatest significant difference. On the other hand, it is found in column D that fabrication process 78 and fabrication apparatus N, which are not shown in FIG. 12, are detected. It is also found that when the fabrication apparatus N is used to process lots in fabrication process 78, the feature amount corresponding to the maximum value of intra-lot wafer failure densities found through a margin test for failure developed regions in level 3 of category 1 provides a significant difference. The two fabrication apparatuses M and N providing the significant difference are detected as the second abnormal apparatuses.

In step S22, the second lot feature amounts, which have allowed detection of the second abnormal apparatuses M and N, are extracted as a second abnormality detected lot feature amount as in step S10.

In step S23, a certain second feature amount threshold for the second abnormality detected lot feature amount for the second abnormal apparatuses M and N is set as in step S11.

In step S24, the second abnormal lot ID with a greater second abnormality detected lot feature amount than the second feature amount threshold is extracted as in step S12.

In step S25, the wafer IDs of wafers W1 through W8 within the lot with the second abnormal lot ID are extracted as the second abnormal wafer IDs from the process history information in the same way as in step S13.

In step S26, the location information of failures in the test target wafer with the second abnormal wafer ID, which is found through a test using the second abnormality detected lot feature amount in manufacturing processes 72 and 78, is extracted from the test information in the same way as in step S14.

In step S27, multiple wafer failure distribution maps are generated from the location information of the failures in the wafer with the second abnormal wafer ID in the lot with the second abnormal lot ID in the same way as in step S15.

Figure 24:
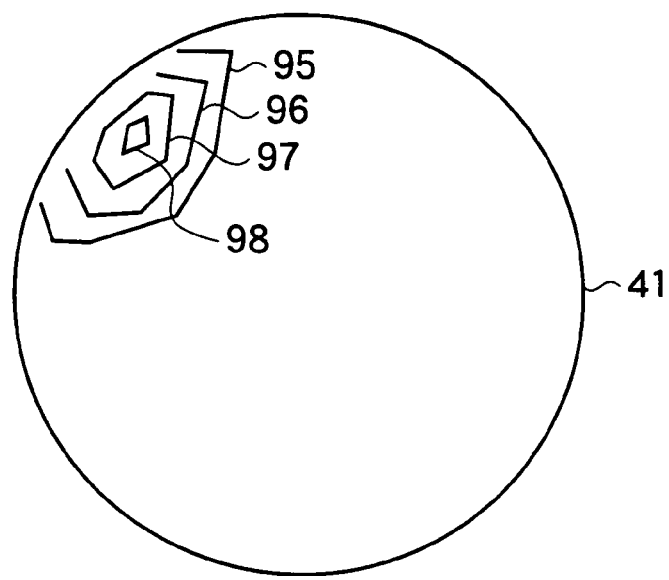
FIGS. 24 and 25 are clustering failure distribution maps of Example 1.

In step S28, the second clustering failure distribution maps of the lots with a higher second lot feature amount in column C as shown in FIG. 24 are generated by stacking the second abnormal wafer failure distribution maps for the second abnormal apparatus M in the same way as in step S16. This clarifies that the fabrication apparatus having caused failures in category 1 is the apparatus M in fabrication process 72.

Figure 25:
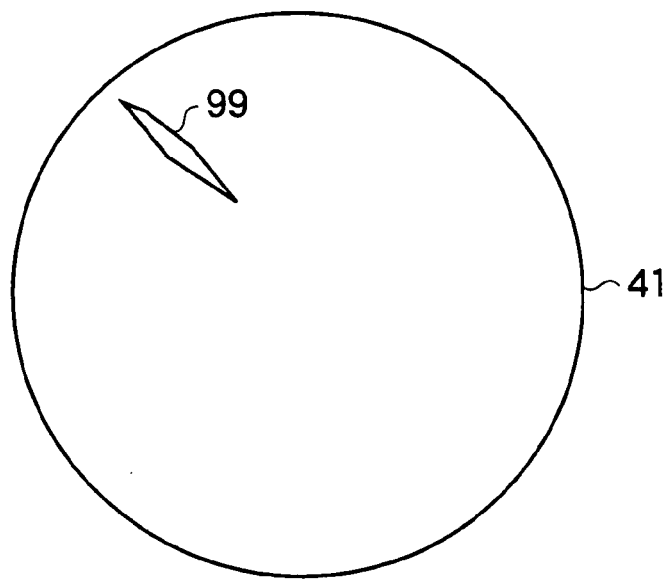
Figure 26A:
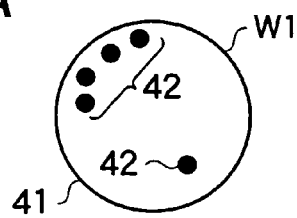
FIGS. 26A through 26H are wafer failure distribution maps of Example 2.
Figure 26E:
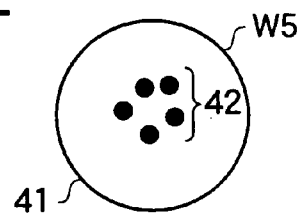
Figure 26B:
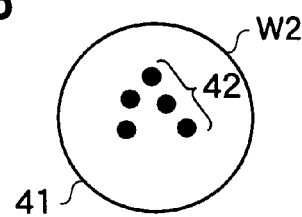
Figure 26F:
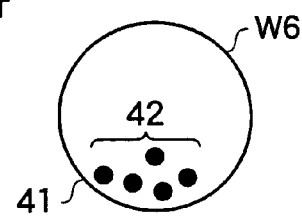
Figure 26C:
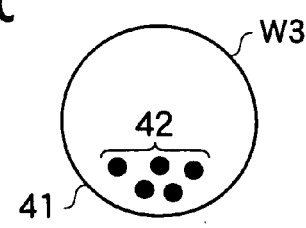
Figure 26G:
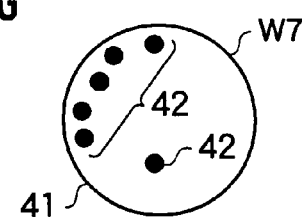
Figure 26D:
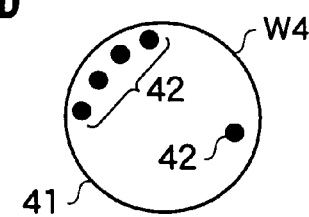
Figure 26H:
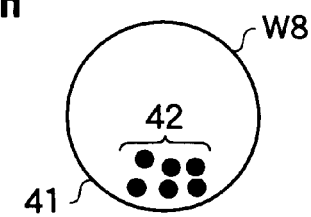
Figure 27A:
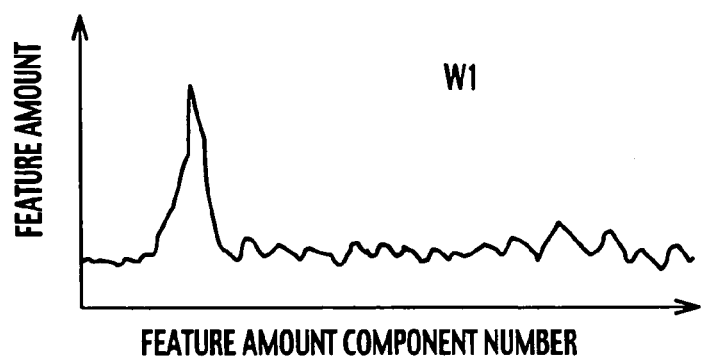
FIGS. 27A through 27D are waveforms representing the wafer feature amounts of Example 2.
Figure 27B:
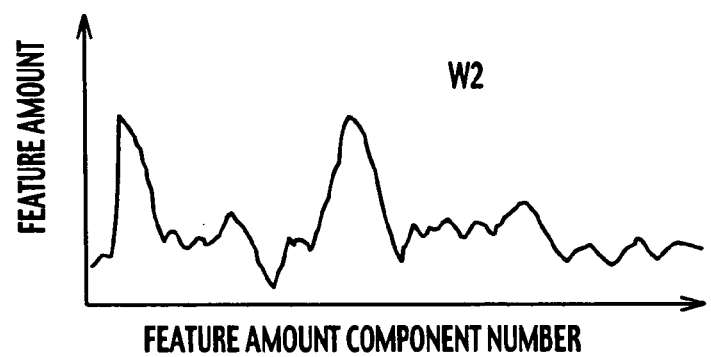
Figure 27C:
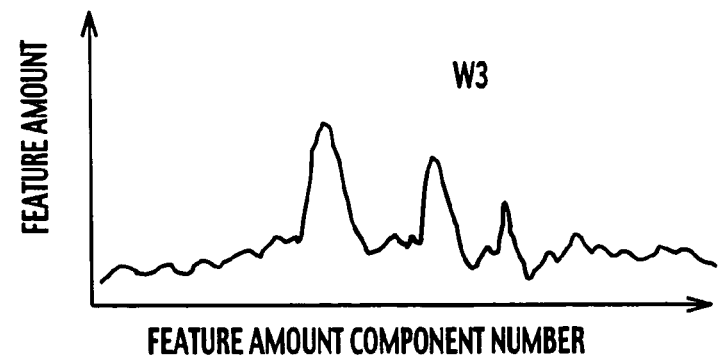
Figure 27D:
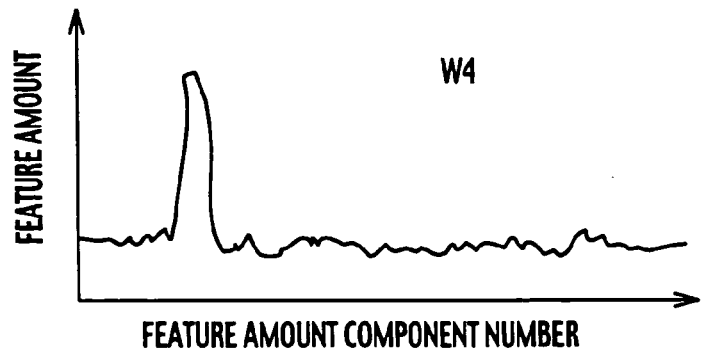

The second clustering failure distribution maps of the lots with a greater second lot feature amount in column D as shown in FIG. 25 are generated by stacking the second abnormal wafer failure distribution maps for the second abnormal apparatus N. It is found in column D in FIG. 23 that the second feature amounts allow detection of fabrication process 78 and the fabrication apparatus N, which could not be detected using the first lot feature amounts. In addition, it is also found that the second clustering failure distribution map shows a failure streak extending at a slant from the upper left portion of the wafer indicated by the failure density contour line 99 in FIG. 25. The reason why detection is achieved using the second feature amounts but not achieved using the first lot feature amounts is because that detection using the first lot feature amounts fails due to subtle failures and the failure distribution overlapping the boundary of the sections for the first lot feature amounts. However, since the second lot feature amounts allow setting of a failure developed region considering the position of the failures centralized in the upper left portion of category 1, and the clustering failure in FIG. 25 develops in the upper left portion of category 1, many feature amounts are systematically prepared for common regions, and thus the clustering failure in FIG. 25 can be detected. In other words, the second lot feature amounts are feature amounts appropriate for detecting failures that are hidden by another failure, for example, the feature amounts in column D of FIG. 23, therefore, there is a high sensitivity to detect an abnormal apparatus.

As described above, usage of systematically defined multiple feature amounts allows establishment of correspondences between clustering failures and causal apparatus. In addition, generation of feature amounts for the failure developed region extracted from the clustering failure categorization results allows highly sensitive detection of an abnormal apparatus.

As described above, Example 1 provides a failure detection method based on the failure distribution for each wafer that allows detection of an abnormal fabrication apparatus. In addition, Example 1 provides a failure detection apparatus that detects, using the failure distribution for each wafer, an abnormal fabrication apparatus used to manufacture semiconductor LSI circuits. Furthermore, Example 1 provides a failure detection program that instructs a computer to detect, based on the failure distribution for each wafer, an abnormal fabrication apparatus used to manufacture semiconductor LSI circuits.

EXAMPLE 2

Figure 4:
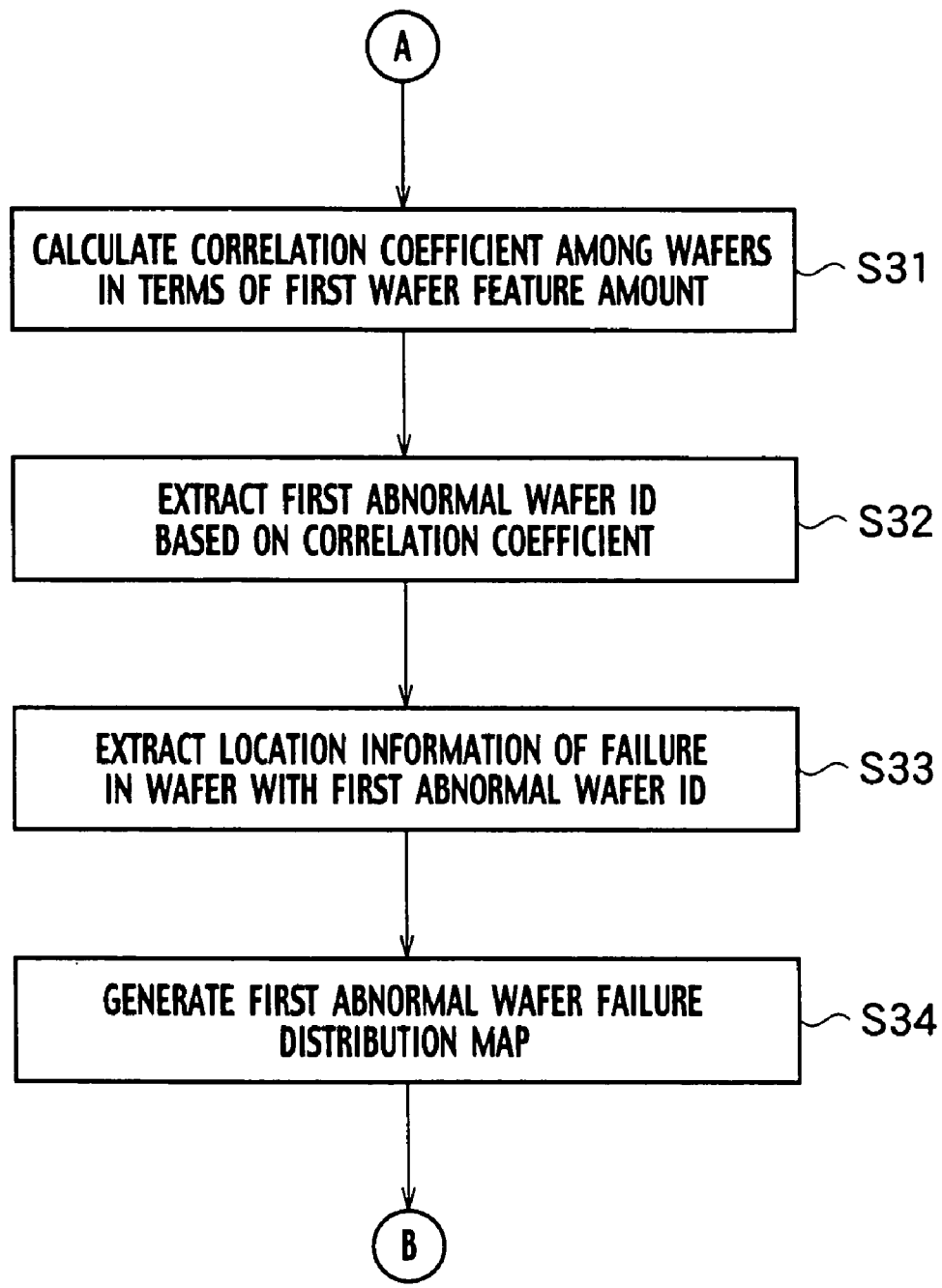

In Example 2, a method of detecting an abnormal apparatus by generating feature amounts from clustering failure categorization results according to categories is described. As the categorization results, a case of using categories generated according to similarity in clustering failures among wafers is described. In Example 2, the failure detection apparatus 1 in FIG. 1 is used. In addition, in Example 2, a failure detection method in which a part of the failure detection method in FIGS. 2 and 3 is replaced with the steps in FIG. 4 is described.

To begin with, steps S1 through S4 in FIG. 2 are carried out in the same way as in Example 1. As shown in FIGS. 26A through 26H, location information of failures in the test target wafers W1 through W8 is extracted from wafer IDs and test information.

In step S5, the first wafer feature amounts are calculated in the same way as in Example 1. In FIGS. 27A through 27D, only the case of wafers W1 through W4 are shown. However, the first wafer feature amounts for each wafer W1 through W8 are sorted in a fixed order, and then the values of the first wafer feature amounts in that order is connected with a broken line, forming a waveform. That waveform of the first wafer feature amounts is a waveform inherent to the wafers W1 through W8. If the waveforms of the first wafer feature amounts, among the wafers, are similar to each other, failure distributions among wafers is also similar to each other. For example, while failure distributions of W1 through W3 in FIGS. 26A through 26C do not appear to resemble each other, failure distributions of W1 in FIG. 26A and W4 in FIG. 26D appear to resemble each other. On the other hand, while the waveforms of the first wafer feature amounts of W1 through W3 in FIGS. 27A through 27C do not appear to resemble each other, the waveforms of the first wafer feature amounts of W1 in FIG. 27A and W4 in FIG. 27D appear to resemble each other. In addition, failure distributions similar to each other is considered to include the same clustering failures. Therefore, in order to detect clustering failures, quantification of the similarity among wafers in terms of waveforms of the first wafer feature amounts is then carried out for quantifying the similarity in wafer failure distributions.

Figure 28A:
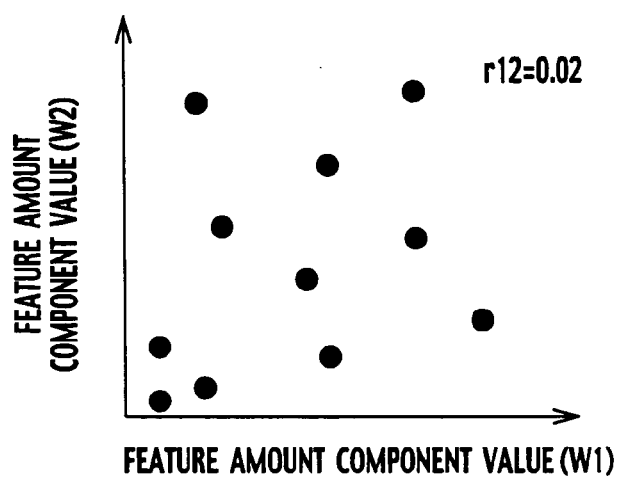
FIGS. 28A through 28C are graphs showing correlation between the wafers of Example 2.
Figure 28B:
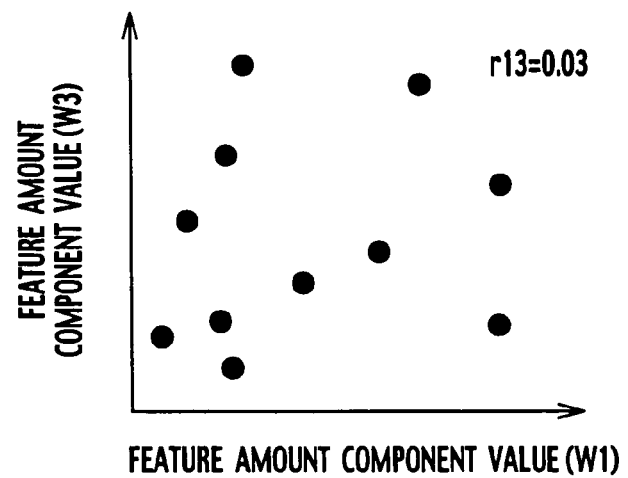
Figure 28C:
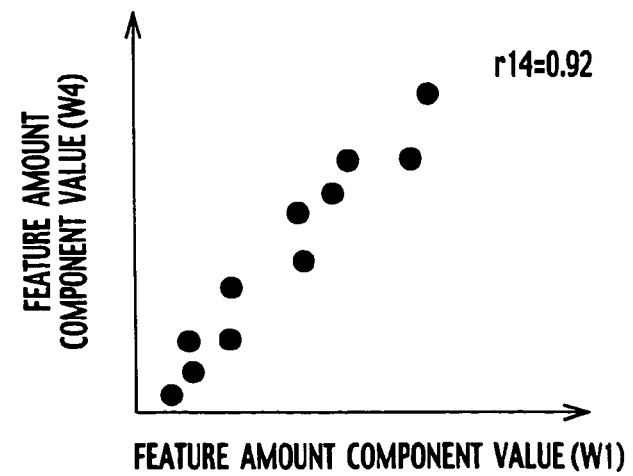

In step S31, the similarity calculation unit 18 quantifies the similarity in the waveforms of the first wafer feature amounts among wafers by representing the degree of similarity among wafers by a correlation coefficient in terms of the first wafer feature amounts. The correlation coefficient in terms of the first wafer feature amounts is calculated for every pair of target wafers. As shown in FIGS. 28A through 28C, inter-wafer correlation can be found from the scatter diagrams in which the first wafer feature amounts for wafers are plotted. There is no correlation in the first wafer feature amounts between wafers W1 and W2 in FIG. 28A. In addition, there is no correlation in the first wafer feature amounts between wafers W1 and W3 in FIG. 28B. On the other hand, there is strong correlation in the first wafer feature amounts between wafers W1 and W4 in FIG. 28C. In order to quantify these correlations, the correlation coefficients rij between wafers i and j in terms of the first wafer feature amounts are found using Equations (4) through (7).

$$r_{ij} = \frac{Cov(i, j)}{\sigma_i \sigma_j} \quad (4)$$

$$Cov(i, j) = \frac{1}{N_g} \sum_k (g_k - \mu_g)(h_k - \mu_h) \quad (5)$$

$$\sigma_i = \sqrt{\left(\frac{1}{N_g} \sum_k g_k^2\right) - \mu_g^2} \quad (6)$$

$$\sigma_i = \sqrt{\left(\frac{1}{N_g} \sum_k h_k^2\right) - \mu_h^2} \quad (7)$$

where, gk and hk denote the first wafer feature amounts for wafers i and j, respectively. In addition, Ng denotes the number of the first wafer feature amounts. ,, g denotes the average of Ng first wafer feature amounts for wafer i, and ,, h denotes the average of Ng first wafer feature amounts for wafer j.

From this, the correlation coefficient r12 between wafers W1 and W2 is 0.02. The correlation coefficient r13 between wafers W1 and W3 is 0.03. The correlation coefficient r14 between wafers W1 and W4 is 0.92.

Figure 29:
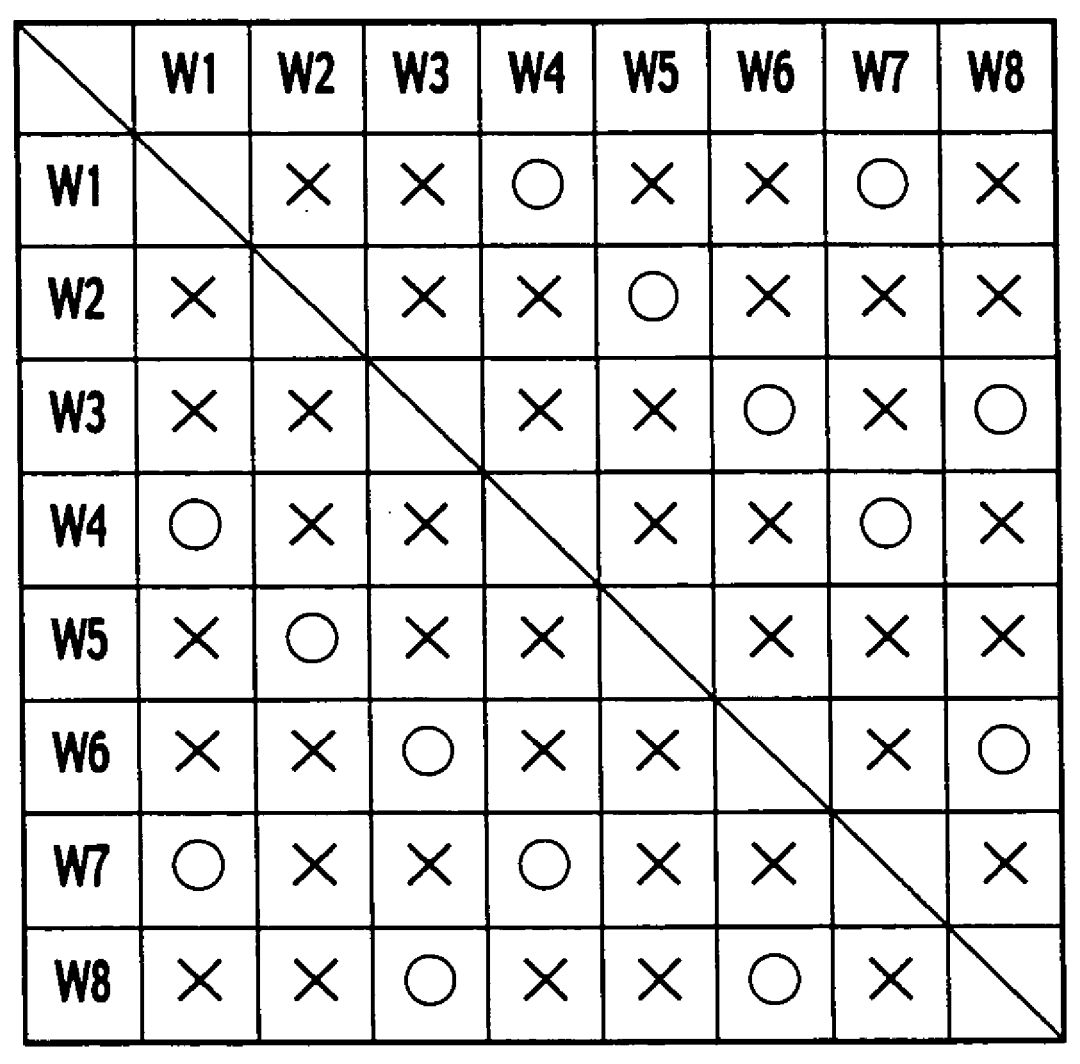

In step S32, the first abnormal wafer IDs are extracted by grouping the wafers having similar failure distribution, based on the calculated correlation coefficients. The threshold for correlation coefficient is set to 0.8. If the correlation coefficient rij is equal to or greater than the threshold of 0.8, it is determined that those wafers i and j have similar failure distributions. As shown in FIG. 29, the correlation coefficients rij which are equal to or greater than the threshold of 0.8 are r14, r41, r17, r71, r25, r52, r36, r63, r38, r83, r47, r74, r68, and r86. Other correlation coefficients rij are less than the threshold of 0.8.

In Example 2, the similar failure distribution among wafers can be quantified using the correlation coefficients rij for the first feature amounts regardless of the type of failure distribution. In addition, wafers with similar failure distributions can be automatically detected.

Wafers with similar failure distributions are then grouped according to similarity in failure distribution among wafers, which is determined using the first feature amounts, and failure categories are automatically generated. Automation of failure category generation allows configuration of a system that automatically outputs a report of problematic failures having occurred at a plant.

To begin with, similar wafer groups S including wafers with similar failure distributions are generated. The similar wafer groups S are generated by identifying another wafer being similar to another wafer.

For example, regarding wafer W1 in FIG. 29, the wafers similar to wafer W1 are wafers W4 and W7. Consequently, a similar wafer group S1 configured with three wafers W1, W4, and W7 is generated as shown in FIG. 30. Regarding wafer W2, the wafer similar to wafer W2 is wafer W5. Consequently, a similar wafer group S2 configured with two wafers W2 and W5 is generated. Similarly, similar wafer groups S3 through S8 are generated as well.

Similarity Rij between the similar wafer groups Si and Sj is calculated. The similarity Rij is defined by the ratio of the number of wafers in the similar wafer groups Si and Sj correlating with each other. In other words, the similarity Rij is defined as the ratio of the number of pairs of wafers correlating with each other to the total number of pairs of wafers belonging to the similar wafer groups Si and Sj. The threshold for the similarity Rij is set to 0.5. It is determined that the similar wafer groups Si and Sj with a greater similarity Rij than the threshold of 0.5 are similar to each other. Note that the similarity Rij may be defined as the ratio of the number of wafers belonging to both the similar wafer groups Si and Sj to the number of wafers belonging to at least either the similar wafer group Si or Sj.

For example, similarity R14 between the similar wafer groups S1 and S4 is the ratio of three pairs of wafers (W1, W4), (W1, W7), and (W4, W7) correlating with each other to all pairs of wafers (W1, W4), (W1, W7), and (W4, W7) belonging to the similar wafer groups S1 and S4, which is 3/3 or 1.0. As shown in FIG. 30, since the similarity R14 is 1.0, which is greater than the threshold of 0.5, it is determined that the similar wafer groups S1 and S4 are similar to each other. Since the similarity R41 is 1.0, which is greater than the threshold of 0.5, it is determined that the similar wafer groups S4 and S1 are similar to each other.

Similarity R12 between the similar wafer groups S1 and S2 is the ratio of four pairs of wafers (W1, W4), (W1, W7), (W2, W5), and (W4, W7) correlating with each other to all ten pairs of wafers (W1, W2), (W1, W4), (W1, W5), (W1, W7), (W2, W4), (W2, W5), (W2, W7), (W4, W5), (W4, W7), and (W5, W7) belonging to the similar wafer groups S1 and S4, which is 4/10 or 0.4. Since the similarity R12 is 0.4, which is less than the threshold of 0.5, it is determined that the similar wafer groups S1 and S2 are not similar to each other. Since similarity R21 is 0.4, which is less than the threshold of 0.5, it is determined that the similar wafer groups S2 and S1 are not similar to each other. Since each of similarities R14, R41, R17, R71, R25, R52, R36, R63, R38, R83, R47, R74, R68, and R86 is 1, which is greater than the threshold of 0.5, it is determined that the pairs of similar wafer groups (S1, S4), (S1, S7), (S3, S6), (S3, S8), (S4, S7), (S6, S8), and (S2, S5) are similar to each other.

Next, as shown in FIG. 30, the similar wafer groups Si are sorted in decreasing order of the number of elements or the number of wafers. The similar wafer groups S1, S3, S4, S6, S7, and S8, each including three wafers, are determined as the first through sixth groups, respectively. The similar wafer groups S2 and S5, each including two wafers, are determined as the seventh and eighth groups, respectively.

The similar wafer groups are grouped in decreasing order of sorted ranking of each similar wafer group, while referencing the determination of similarity based on similarity Rij. To begin with, the similar wafer groups S4 and S7 determined to be similar to the similar wafer group S1 with the highest sorted ranking are grouped together. A failure category C1 is assigned to these similar wafer groups S1, S4, and S7 as an identifier.

The highest ranking of the similar wafer group S1 is the similar wafer group S3, other than the similar wafer group S1 and the similar wafer groups Si grouped in that similar wafer group S1. Regarding the similar wafer group S3, similar wafer groups Si not assigned with the failure category C1 and determined as being similar to that similar wafer group S3 are similar wafer groups S6 and S8. Therefore, the similar wafer groups S3, S6, and S8 configure a group, and a failure category C2 is assigned as an identifier thereto.

Regarding the similar wafer groups Si not grouped yet, the highest ranked similar wafer group Si is the similar wafer group S2. Regarding the similar wafer group S2, the similar wafer group Si, not assigned to the failure category C1 or C2 and determined as being similar to that similar wafer group S2, is similar wafer group S5. Therefore, the similar wafer groups S2 and S5 configure a group, and a failure category C3 is assigned as an identifier thereto. This grouping is effective since there are many cases where the upper ranked similar wafer groups Si include almost the same wafers as elements.

After having grouped the similar wafer groups Si, the sets of wafers except for shared wafers in each failure category C-assigned group belong to the failure categories C1, C2, and C3. The ratio of the number of wafers correlating to each other in terms of the first feature amounts to the number of wafers belonging to the respective failure categories C1, C2, or C3 is then calculated for each wafer. If this ratio is equal to or greater than a predetermined threshold, the respective wafers belong to one of the corresponding failure categories C1, C2, and C3. This allows determination of a failure category C1, C2, or C3 for which each wafer to belong. That is, extraction of the first abnormal wafer IDs with a similar failure distribution for each of the failure categories C1, C2, or C3. Note that in this case, a single wafer may belong to multiple categories C1, C2, and C3.

Specifically, the above-discussed threshold is set to 0.4. Wafer W1 correlates with two wafers W4 and W7 in terms of the failure category C1. Since the failure category C1 includes three wafers W1, W4, and W7, the ratio of the number of wafers is 2/3 or 0.66. Since this ratio is larger than the threshold of 0.4, wafer W1 belongs to the failure category C1. On the other hand, wafer W1 does not correlate with other wafers in terms of the failure categories C2 and C3. Therefore, the ratio of the number of wafers is zero. Since this ratio of wafer W1 is smaller than the threshold of 0.4, wafer W1 does not belong to the failure categories C2 and C3.

Wafer W4 correlates with two wafers W1 and W7 in terms of the failure category C1. Since the failure category C1 includes three wafers W1, W4, and W7, the ratio of the number of wafers is 2/3 or 0.66. Since this ratio of wafer W4, 0.66 is larger than the threshold of 0.4, wafer W4 belongs to the failure category C1. On the other hand, wafer W4 does not correlate with other wafers in terms of the failure categories C2 and C3. Therefore, the ratio of the number of wafers is zero. Since this ratio of wafer W4 is smaller than the threshold of 0.4, wafer W4 does not belong to the failure categories C2 and C3. Similarly, categories for all wafers W1 through W8 are determined as well, respectively.

A wafer correlating with the largest number of other wafers in terms of the first wafer feature amounts is selected from the wafers in each failure category C and determined as a representative wafer. For example, of the wafers W1, W4, and W7 in the failure category C1, wafers W1, W4, and W7 correlating to each other are determined as representative wafers.

The wafers correlating with the representative wafer in each failure category C in terms of the first wafer feature amounts are determined to form a representative wafer group. For example, wafers W1, W4, and W7 correlating with the representative wafers W1, W4, and W7 in the failure category C1 are determined as a representative wafer group. Similarly, wafers W3, W6, and W8 correlating with the representative wafers W3, W6, and W8 in the failure category C2 are determined as a representative wafer group. In addition, wafers W2 and W5 correlating with the representative wafers W2 and W5 in the failure category C3 are determined as a representative wafer group.

In step S33, the location information of the failures with the first abnormal wafer IDs is extracted from the test information. In step S34, multiple wafer failure distribution maps are generated as the first abnormal wafer failure distribution maps for each of the failure categories C1, C2, C3 from the location information of failures with the first abnormal wafer IDs. Multiple wafer failure distribution maps are generated for the wafers W1 through W8 from the location information of failures with the first abnormal wafer IDs as shown in FIG. 18. Note that failure category C1 corresponds to category 1, failure category C2 corresponds to category 3, and failure category C3 corresponds to category 2.

Hereinafter, returning to B in FIG. 2, the processes in step S16 and subsequent steps are executed in the same way as in Example 1.

As described above, Example 2 provides a failure detection method that allows detection of an abnormal fabrication apparatus, which is used to manufacture semiconductor LSI circuits, based on the failure distribution for each wafer. In addition, Example 2 provides a failure detection apparatus that detects an abnormal fabrication apparatus, based on the failure distribution for each wafer. Furthermore, Example 2 provides a failure detection program that instructs a computer to detect an abnormal fabrication apparatus, which is used to manufacture semiconductor LSI circuits, using the failure distribution for each wafer.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A method of detecting a fabrication apparatus generating a wafer failure using process history information, the method comprising:
    providing a plurality of sections in each of wafers;
    inputting a lot ID of a target lot;
    extracting a wafer ID of a target wafer among a plurality of wafers in the target lot from the lot ID and the process history information;
    extracting a failure location information in the target wafer from the wafer ID and test information configured to extract the failure location information in the wafers;
    calculating a to-be-quantified first wafer feature amount for unevenness of a wafer failure distribution based on the sections for the target wafer;
    calculating a first lot feature amount for the target lot from the first wafer feature amount calculated for the target wafer for each of combinations of the sections, types of tests extracted from the test information, methods for calculating the first wafer feature amount, and methods for calculating the first lot feature amount;
    extracting a fabrication process for the target lot and fabrication apparatuses used in the extracted fabrication process from the process history information using the lot ID of the target lot as an extraction condition;
    carrying out significant tests for the fabrication apparatuses used in the extracted fabrication process based on the first lot feature amount; and
    detecting a fabrication apparatus with a significant difference as a first abnormal apparatus.

2. The method as claimed in claim 1, further comprising:
    extracting the first lot feature amount to detect the first abnormal apparatus, as a first abnormality detected lot feature amount;
    setting a first feature amount threshold for the first abnormality detected lot feature amount; and
    extracting the lot ID of the target lot with the first abnormal detecting lot feature amount larger than the first feature amount threshold, as a first abnormal lot ID.

3. The method as claimed in claim 2, further comprising:
    extracting the wafer ID of a wafer in a lot with the first abnormal lot ID from the process history information, as a first abnormal wafer ID;
    extracting the location information of a failure with the first abnormal wafer ID determined by using the first abnormality detected lot feature amount from the test information; and
    generating a plurality of wafer failure distribution maps as first abnormal wafer failure distribution maps from the location information of the failures with the first abnormal wafer ID.

4. A method of detecting a wafer failure using process history information, the method comprising:
    providing a plurality of sections in each of wafers;
    inputting a lot ID of a target lot;
    extracting a wafer ID of a target wafer among a plurality of wafers in the target lot from the lot ID and the process history information;
    extracting the location information of a failure in the target wafer from the wafer ID and test information configured to extract a failure location information in the wafers;
    calculating a to-be-quantified first wafer feature amount for unevenness of the wafer failure distribution based on the sections for the target wafer;
    representing similarity among the wafers in the target lot by a correlation coefficient calculated for every pair of the wafers in the target lot in terms of the first wafer feature amount;
    grouping the wafers based on whether the similarity is equal to or greater than a predetermined correlation coefficient threshold as a first abnormal wafer ID;
    extracting the failure location information with the first abnormal wafer ID from the test information; and
    generating a plurality of wafer failure distribution maps as first abnormal wafer failure distribution maps from the failure location information with the first abnormal wafer ID.

5. The method as claimed in claim 3, further comprising:
generating a first clustering failure distribution map based on the first abnormal wafer failure distribution maps.

6. The method as claimed in claim 5, further comprising:
setting a failure developed region with a failure density higher than a density threshold according to the first clustering failure distribution map, in the target wafer for each density threshold;

calculating a to-be-quantified second wafer feature amount for the unevenness of the wafer failure distribution based on the sections for the target wafer;

calculating a second lot feature amount for each target lot from the second wafer feature amount calculated for the target wafer;

carrying out a significant test for a fabrication apparatus used in each fabrication process based on the second lot feature amount; and detecting the fabrication apparatus with a significant difference as a second abnormal apparatus.

7. The method as claimed in claim 6, further comprising:

extracting the second lot feature amount to detect the second abnormal apparatus, as a second abnormality detected lot feature amount;

setting a second feature amount threshold for the second abnormality detected lot feature amount; and extracting the lot ID of the target lot with the second abnormality detected lot feature amount larger than the second feature amount threshold, as a second abnormal lot ID.

8. The method as claimed in claim 7, further comprising:

extracting the wafer ID of a wafer in a lot with the second abnormal lot ID from the process history information, as a second abnormal wafer ID;

extracting the location information of the failure with the second abnormal wafer ID determined by using the second abnormality detected lot feature amount, from the test information; and generating a plurality of wafer failure distribution maps as second abnormal wafer failure distribution maps from the location information of the failures with the second abnormal wafer ID.

9. The method as claimed in claim 8, further comprising:

generating a second clustering failure distribution map based on the second abnormal wafer failure distribution maps.

10. The method as claimed in claim 1, wherein the sections are overlapped sections of a section formed by partitioning the entire circular wafer into sections each having a fixed angle, and a section formed by partitioning the circular wafer into sections based on the distance from the center of the wafers.

11. The method as claimed in claim 1, wherein the test is at least one of a DC test, a function test, and a margin test.

12. The method as claimed in claim 1, wherein the first wafer feature amount includes failure density, which is a failure development rate for each section, and inhomogeneity of failure distribution centralized in the sections of the wafers, represented by a CHI-SQUARE ($\chi^2$)-tested value.

13. The method as claimed in claim 12, wherein the first lot feature amount is at least one of: an average, a maximum value, and a higher ranking average of the failure densities of target wafers in the target lot; and the average, the maximum value, and the higher ranking average of the inhomogeneities of target wafers in the target lot; and inhomogeneity due to wafer IDs, and inhomogeneity due to first or latter half wafer IDs.

14. The method as claimed in claim 1, wherein said carrying out a significant test for the fabrication apparatuses is to calculate a CHI-SQUARE ($\chi^2$)-tested value for the fabrication apparatuses for each fabrication process using the first lot feature amount for the target lot processed by the fabrication apparatuses.

15. The method as claimed in claim 2, wherein the setting of the first feature amount threshold comprising:

calculating a first concomitant ratio, which is the sum of a first ratio and a second ratio; where the first ratio denotes the ratio of the number of lots processed by the first abnormal apparatus to number of lots processed by all fabrication apparatus used in the same fabrication process as the first abnormal apparatus when the first abnormality detected lot feature amount is equal to or less than a certain threshold; and the second ratio denotes the ratio of the number of the lots processed by other fabrication apparatus used in the same fabrication process as the first abnormal apparatus to number of lots processed by all fabrication apparatus used for the same fabrication process as the first abnormal apparatus when the first abnormality detected lot feature amount is equal to or larger than that certain threshold; and calculating a threshold for the first abnormality detected lot feature amount such that the first concomitant ratio is a minimum, and defining the minimum as the first feature amount threshold.

16. The method as claimed in claim 5, wherein the generating of the first clustering failure distribution map comprises stacking the first abnormal wafer failure distribution maps and integrating the first abnormal wafer failure distributions, or calculating a logical sum of failures developed at the same intra-wafer location in the first abnormal wafer failure distribution maps.

17. The method as claimed in claim 7, wherein the setting of the second feature amount threshold comprising:

calculating a second concomitant ratio, which is the sum of a first ratio and a second ratio; where the first ratio denotes the ratio of the number of lots processed by the second abnormal apparatus to number of lots processed by all fabrication apparatus used in the same fabrication process as the second abnormal apparatus when the second abnormality detected lot feature amount is equal to or less than a certain threshold; and the second ratio denotes the ratio of the number of the lots processed by other fabrication apparatus used in the same fabrication process as the second abnormal apparatus to number of lots processed by all fabrication apparatus used for the same fabrication process as the second abnormal apparatus when the first abnormality detected lot feature amount is equal to or larger than that certain threshold; and calculating a threshold for the second abnormality detected lot feature amount such that the second concomitant ratio is a minimum, and defining the minimum as the second feature amount threshold.

18. The method as claimed in claim 9, wherein the generating of the second clustering failure distribution maps includes stacking the second abnormal wafer failure distribution maps and integrating the second abnormal wafer failure distributions, or calculating a logical sum of failures developed at the same intra-wafer location in the second abnormal wafer failure distribution maps.

19. An apparatus for detecting a fabrication apparatus generating a wafer failure using process history information, the apparatus comprising:

a section setting unit providing a plurality of sections in each of wafers;

an input unit to input a lot ID of a target lot;

a wafer ID extraction unit to extract a wafer ID of a target wafer among a plurality of wafers in the target lot from the lot ID and the process history information;

a location information extraction unit to extract the location information of the failure in the target wafer found through a test, from the wafer ID and test information configured to extract a failure location information in the wafers;

a wafer feature amount calculation unit to calculate a to-be-quantified first wafer feature amount corresponding to unevenness of the wafer failure distribution based on the sections for the target wafer;

a lot feature amount calculation unit to calculate a first lot feature amount for the target lot from the first wafer feature amount calculated for the target wafer for each of combinations of the sections, types of tests extracted from the test information, methods for calculating the first wafer feature amount, and methods for calculating the first lot feature amount;

a fabrication apparatus extraction unit to extract a fabrication process for the target lot and a fabrication apparatus used in that fabrication process from the process history information using the lot ID of the target lot as an extraction condition;

a significant test unit conducting a significant test for the fabrication apparatus in each fabrication process based on the first lot feature amount; and an abnormal apparatus detection unit to detect the fabrication apparatus with a significant difference as a first abnormal apparatus.

* * * * *